(12) United States Patent
Kawata et al.

(10) Patent No.: US 9,941,483 B2
(45) Date of Patent: Apr. 10, 2018

(54) LIGHT-EMITTING ELEMENT, LIGHT-EMITTING DEVICE, ELECTRONIC APPLIANCE, AND LIGHTING DEVICE

(71) Applicant: Semiconductor Energy Laboratory Co., Ltd., Atsugi-shi, Kanagawa-ken (JP)

(72) Inventors: Takuya Kawata, Kanagawa (JP); Nobuharu Ohsawa, Kanagawa (JP); Yusuke Nonaka, Kanagawa (JP); Takahiro Ishisone, Kanagawa (JP); Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/178,638

(22) Filed: Jun. 10, 2016

(65) Prior Publication Data

US 2016/0308156 A1    Oct. 20, 2016

Related U.S. Application Data

(63) Continuation of application No. 14/548,621, filed on Nov. 20, 2014, now Pat. No. 9,368,742.

(30) Foreign Application Priority Data

Dec. 2, 2013  (JP) .................................. 2013-249206
May 15, 2014  (JP) .................................. 2014-101046

(51) Int. Cl.
*H01L 51/00*    (2006.01)
*H01L 51/50*    (2006.01)

(52) U.S. Cl.
CPC ........ *H01L 51/504* (2013.01); *H01L 51/0097* (2013.01); *H01L 51/5016* (2013.01);
(Continued)

(58) Field of Classification Search
None
See application file for complete search history.

(56) References Cited

U.S. PATENT DOCUMENTS

| 5,281,489 A | 1/1994 | Mori et al. |
| 6,911,271 B1 | 6/2005 | Lamansky et al. |

(Continued)

FOREIGN PATENT DOCUMENTS

| CN | 001655657 A | 8/2005 |
| CN | 101022157 A | 8/2007 |

(Continued)

OTHER PUBLICATIONS

International Search Report (Application No. PCT/IB2014/066143) dated Mar. 31, 2015.
(Continued)

*Primary Examiner* — Evren Seven
(74) *Attorney, Agent, or Firm* — Fish & Richardson P.C.

(57) ABSTRACT

A light-emitting element includes a stack of a first light-emitting layer emitting fluorescent light and a second light-emitting layer emitting phosphorescent light between a pair of electrodes. The second light-emitting layer includes a first layer in which an exciplex is formed, a second layer in which an exciplex is formed, and a third layer in which an exciplex is formed. The second layer is located over the first layer, and the third layer is located over the second layer. An emission peak wavelength of the second layer is longer than an emission peak wavelength of the first layer and an emission peak wavelength of the third layer.

27 Claims, 10 Drawing Sheets

(52) U.S. Cl.
CPC ........ *H01L 51/5028* (2013.01); *H01L 51/006* (2013.01); *H01L 51/0052* (2013.01); *H01L 51/0054* (2013.01); *H01L 51/0058* (2013.01); *H01L 51/0061* (2013.01); *H01L 51/0072* (2013.01); *H01L 51/0074* (2013.01); *H01L 51/0085* (2013.01); *H01L 2251/5376* (2013.01)

(56) References Cited

U.S. PATENT DOCUMENTS

| | | | |
|---|---|---|---|
| 6,939,624 | B2 | 9/2005 | Lamansky et al. |
| 6,995,509 | B2 | 2/2006 | Yamazaki et al. |
| 7,009,338 | B2 | 3/2006 | D'Andrade et al. |
| 7,175,922 | B2 | 2/2007 | Jarikov et al. |
| 7,183,010 | B2 | 2/2007 | Jarikov |
| 7,285,907 | B2 | 10/2007 | D'Andrade et al. |
| 7,332,857 | B2 | 2/2008 | Seo et al. |
| 7,381,479 | B2 | 6/2008 | Lamansky et al. |
| 7,553,560 | B2 | 6/2009 | Lamansky et al. |
| 7,597,967 | B2 | 10/2009 | Kondakova et al. |
| 7,771,844 | B2 | 8/2010 | Inoue et al. |
| 7,943,925 | B2 | 5/2011 | Yamazaki |
| 7,993,760 | B2 | 8/2011 | Komori et al. |
| 8,034,465 | B2 | 10/2011 | Liao et al. |
| 8,274,214 | B2 | 9/2012 | Ikeda et al. |
| 8,461,574 | B2 | 6/2013 | Nishimura et al. |
| 8,476,823 | B2 | 7/2013 | Kuma et al. |
| 8,564,190 | B2 | 10/2013 | Seo et al. |
| 8,653,553 | B2 | 2/2014 | Yamazaki et al. |
| 8,723,171 | B2 | 5/2014 | Nishimura et al. |
| 8,853,680 | B2 | 10/2014 | Yamazaki et al. |
| 8,883,323 | B2 | 11/2014 | Kawamura et al. |
| 8,945,722 | B2 | 2/2015 | Thompson et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,070,884 | B2 | 6/2015 | Tung et al. |
| 9,153,790 | B2 | 10/2015 | Kuma et al. |
| 9,159,942 | B2 | 10/2015 | Seo et al. |
| 9,175,213 | B2 | 11/2015 | Seo et al. |
| 9,324,950 | B2 | 4/2016 | Kawamura et al. |
| 9,356,250 | B2 | 5/2016 | Ohsawa et al. |
| 9,604,928 | B2 | 3/2017 | Shitagaki et al. |
| 9,647,227 | B2 | 5/2017 | Tung et al. |
| 9,812,661 | B2 | 11/2017 | Kuma et al. |
| 2003/0091862 | A1 | 5/2003 | Tokito et al. |
| 2003/0175553 | A1 | 9/2003 | Thompson et al. |
| 2005/0048310 | A1 | 3/2005 | Cocchi et al. |
| 2005/0074630 | A1 | 4/2005 | Kanno et al. |
| 2005/0106415 | A1 | 5/2005 | Jarikov et al. |
| 2005/0221116 | A1 | 10/2005 | Cocchi et al. |
| 2006/0134464 | A1 | 6/2006 | Nariyuki |
| 2006/0232194 | A1 | 10/2006 | Tung et al. |
| 2006/0273714 | A1 | 12/2006 | Forrest et al. |
| 2007/0090756 | A1 | 4/2007 | Okada et al. |
| 2008/0284318 | A1 | 11/2008 | Deaton et al. |
| 2008/0286610 | A1 | 11/2008 | Deaton et al. |
| 2009/0308456 | A1 | 12/2009 | Rand et al. |
| 2010/0127246 | A1 | 5/2010 | Nakayama et al. |
| 2010/0295444 | A1 | 11/2010 | Kuma et al. |
| 2010/0295445 | A1 | 11/2010 | Kuma et al. |
| 2010/0314644 | A1 | 12/2010 | Nishimura et al. |
| 2011/0057178 | A1 | 3/2011 | Shitagaki et al. |
| 2011/0082296 | A1 | 4/2011 | Inoue et al. |
| 2011/0210316 | A1 | 9/2011 | Kadoma et al. |
| 2011/0215301 | A1 | 9/2011 | Forrest |
| 2012/0126205 | A1 | 5/2012 | Kawamura et al. |
| 2012/0205632 | A1 | 8/2012 | Shitagaki et al. |
| 2012/0205687 | A1 | 8/2012 | Yamazaki et al. |
| 2012/0217486 | A1 | 8/2012 | Takemura et al. |
| 2012/0217487 | A1 | 8/2012 | Yamazaki et al. |
| 2012/0235127 | A1 | 9/2012 | Takasu et al. |
| 2013/0060033 | A1 | 3/2013 | Seo et al. |
| 2013/0092913 | A1 | 4/2013 | Nishimura et al. |
| 2013/0240851 | A1 | 9/2013 | Seo et al. |
| 2013/0240933 | A1 | 9/2013 | Yamazaki et al. |
| 2013/0277653 | A1 | 10/2013 | Osaka et al. |
| 2013/0277654 | A1 | 10/2013 | Seo et al. |
| 2013/0277656 | A1 | 10/2013 | Seo et al. |
| 2013/0292656 | A1 | 11/2013 | Seo et al. |
| 2014/0014930 | A1 | 1/2014 | Hirose et al. |
| 2014/0034924 | A1 | 2/2014 | Kawatay et al. |
| 2014/0034925 | A1 | 2/2014 | Osakah et al. |
| 2014/0034927 | A1 | 2/2014 | Seos et al. |
| 2014/0042469 | A1 | 2/2014 | Seo et al. |
| 2014/0061604 | A1 | 3/2014 | Seo et al. |
| 2014/0145168 | A1 | 5/2014 | Ohsawa et al. |
| 2014/0159097 | A1 | 6/2014 | Yamazaki et al. |
| 2014/0291647 | A1 | 10/2014 | Suzuki et al. |
| 2014/0340888 | A1 | 11/2014 | Ishisone et al. |
| 2015/0069352 | A1 | 3/2015 | Kim et al. |
| 2015/0194609 | A1* | 7/2015 | Nishide ................ C07D 405/14 257/40 |
| 2016/0104749 | A1* | 4/2016 | Tsuji ................... H01L 51/5044 257/40 |
| 2016/0254459 | A1 | 9/2016 | Kawamura et al. |
| 2017/0207408 | A1 | 7/2017 | Tung et al. |

FOREIGN PATENT DOCUMENTS

| | | |
|---|---|---|
| CN | 101584057 A | 11/2009 |
| CN | 101681996 A | 3/2010 |
| CN | 101682002 A | 3/2010 |
| CN | 101931054 A | 12/2010 |
| CN | 102428588 A | 4/2012 |
| CN | 102428589 A | 4/2012 |
| CN | 102439749 A | 5/2012 |
| CN | 102655222 A | 9/2012 |
| CN | 102668159 A | 9/2012 |
| CN | 102709482 A | 10/2012 |
| CN | 103187537 A | 7/2013 |
| CN | 103378300 A | 10/2013 |
| CN | 104167494 A | 11/2014 |
| CN | 104170111 A | 11/2014 |
| DE | 112013001468 | 12/2014 |
| DE | 112013002110 | 1/2015 |
| EP | 1202608 A | 5/2002 |
| EP | 2434558 A | 3/2012 |
| EP | 2434559 A | 3/2012 |
| EP | 2442379 A | 4/2012 |
| EP | 3104428 A | 12/2016 |
| JP | 2004-522276 | 7/2004 |
| JP | 2008-288344 A | 11/2008 |
| JP | 2013-219024 A | 10/2013 |
| JP | 2013-219347 A | 10/2013 |
| JP | 2013-236058 A | 11/2013 |
| JP | 2013-239703 A | 11/2013 |
| JP | 2014-209607 A | 11/2014 |
| JP | 2014-241405 A | 12/2014 |
| KR | 2013-0116185 A | 10/2013 |
| KR | 2014-0118790 A | 10/2014 |
| TW | 201347265 | 11/2013 |
| TW | 201349614 | 12/2013 |
| TW | 201401602 | 1/2014 |
| TW | 201401604 | 1/2014 |
| WO | WO-2006/113106 | 10/2006 |
| WO | WO-2008/054578 | 5/2008 |
| WO | WO-2008/143791 | 11/2008 |
| WO | WO-2008/143796 | 11/2008 |
| WO | WO-2012/070233 | 5/2012 |
| WO | WO-2012/070234 | 5/2012 |
| WO | WO-2013/137088 | 9/2013 |
| WO | WO-2013/137089 | 9/2013 |
| WO | WO-2013/157591 | 10/2013 |

OTHER PUBLICATIONS

Written Opinion (Application No. PCT/IB2014/066143) dated Mar. 31, 2015.

Yersin.H et al., Highly Efficient OLEDs with Phosphorescent Materials, 2008, pp. 1-97,283-309.

(56) References Cited

OTHER PUBLICATIONS

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Chinese Office Action (Application No. 201480065826.4) dated Apr. 28, 2017.

Chinese Office Action (Application No. 201480065826.4) dated Nov. 1, 2017.

* cited by examiner

FIG. 3A
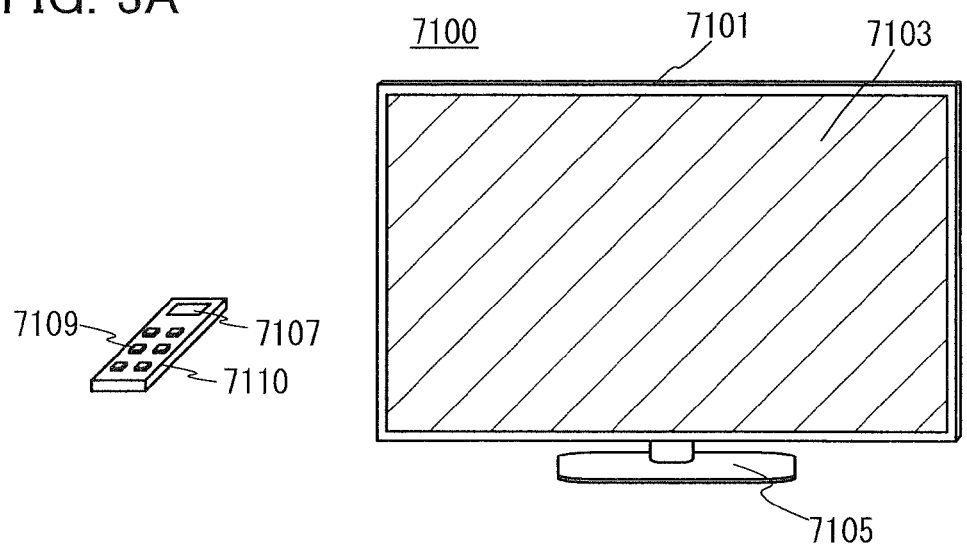
FIG. 3B
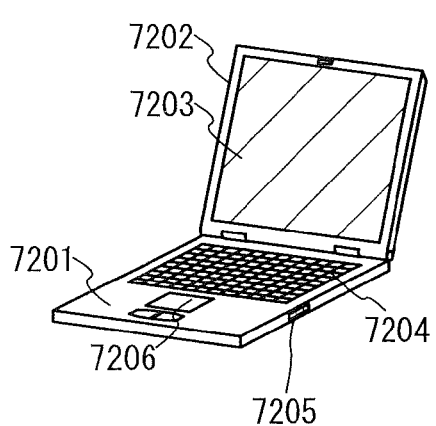
FIG. 3C
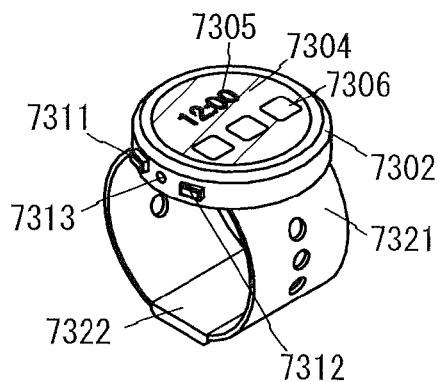
FIG. 3D
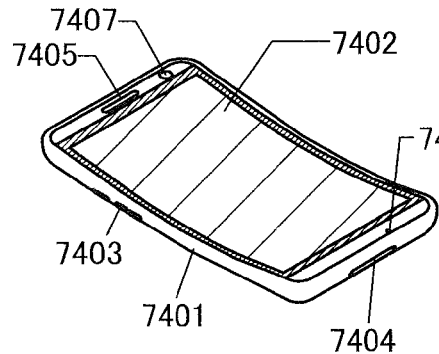
FIG. 3D'1
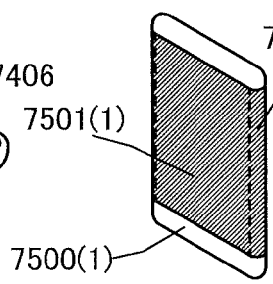
FIG. 3D'2
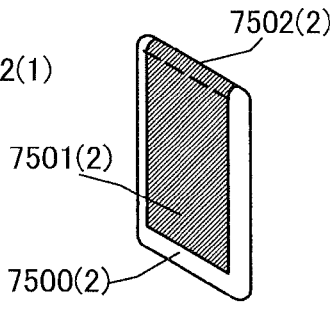

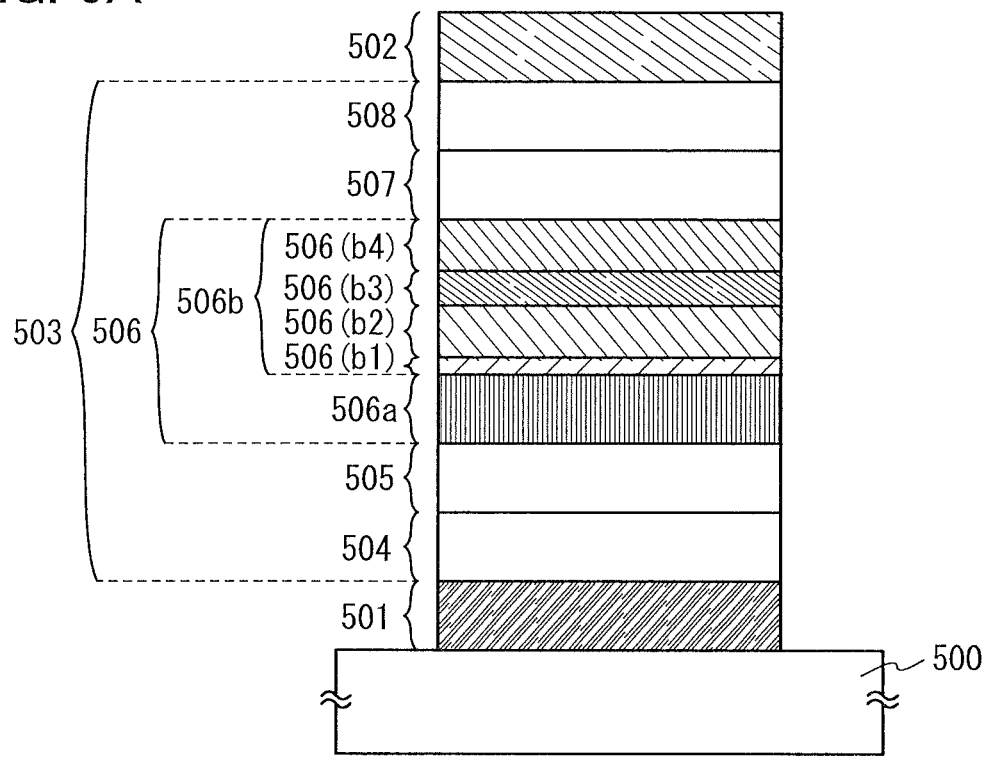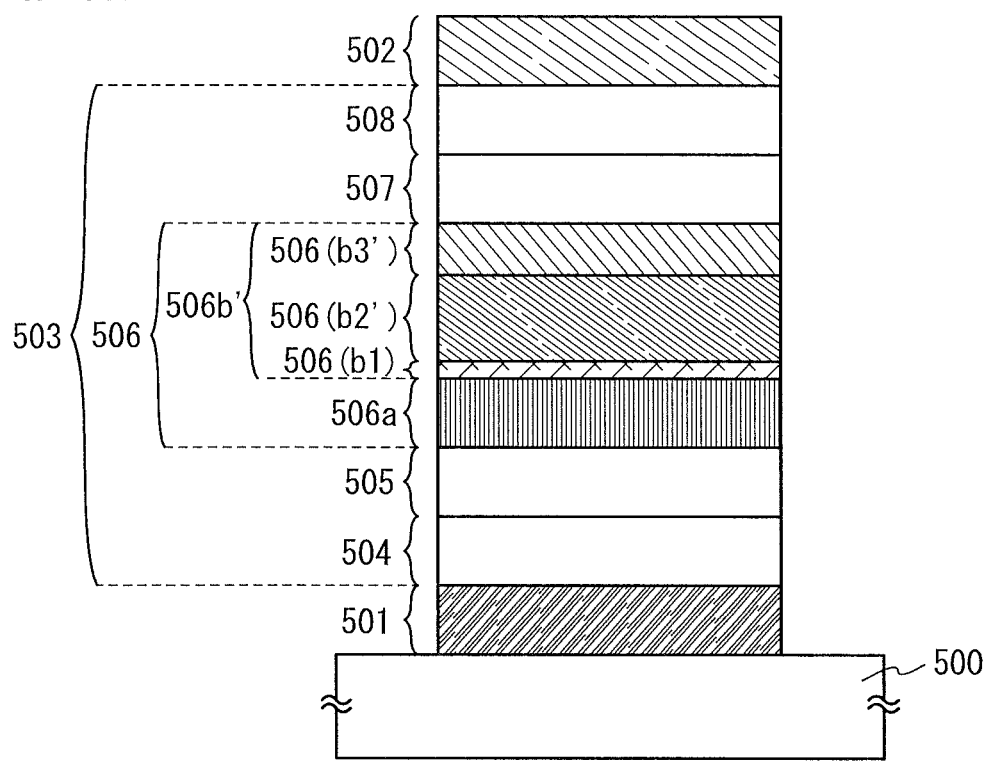

LIGHT-EMITTING ELEMENT, LIGHT-EMITTING DEVICE, ELECTRONIC APPLIANCE, AND LIGHTING DEVICE

CROSS-REFERENCE TO RELATED APPLICATIONS

This application is a continuation of U.S. application Ser. No. 14/548,621 filed Nov. 20, 2014, now allowed, which claims the benefit of foreign priority applications filed in Japan as Serial No. 2013-249206 on Dec. 2, 2013 and Ser. No. 2014-101046 on May 15, 2014, all of which are incorporated by reference.

TECHNICAL FIELD

One embodiment of the present invention relates to a light-emitting element in which an organic compound that emits light by application of an electric field is provided between a pair of electrodes, and also relates to a light-emitting device, an electronic appliance, and a lighting device that include such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

A light-emitting element using an organic compound as a luminous body, which has features such as thinness, lightness, high-speed response, and DC drive at low voltage, is expected to be used in a next-generation flat panel display. In particular, a display device in which light-emitting elements are arranged in matrix is considered to have advantages in a wide viewing angle and excellent visibility over a conventional liquid crystal display device.

The light emission mechanism is said to be as follows: when a voltage is applied between a pair of electrodes with an EL layer including a luminous body provided therebetween, carriers (electrons and holes) are injected from the electrodes, and the carriers recombine to form excitons, and energy is released and light is emitted when the excitons return to the ground state. A singlet excited state ($S^*$) and a triplet excited state ($T^*$) are known as excited states. Light emission from the singlet excited state is called fluorescence and light emission from the triplet excited state is called phosphorescence. The statistical generation ratio of the excited states in a light-emitting element is considered to be $S^*:T^*=1:3$.

To improve element characteristics of such a light-emitting element, a light-emitting element containing a phosphorescent substance in which intersystem crossing (i.e., transition from a singlet excited state to a triplet excited state) easily occurs has been actively developed. Furthermore, a light-emitting element in which layers containing different phosphorescent substances are stacked for white light emission is disclosed (see, for example, Patent Document 1).

REFERENCE

Patent Document 1: Japanese Published Patent Application No. 2004-522276

DISCLOSURE OF INVENTION

In a light-emitting element having the above-described structure, light-emitting layers emitting phosphorescence (i.e., phosphorescent layers) are stacked. The structure is employed for the following reasons: high emission efficiency can be obtained by utilizing phosphorescence; and when a layer emitting fluorescence (a fluorescent layer) and a layer emitting phosphorescence (a phosphorescent layer) are stacked, triplet excitons generated in the phosphorescent layer are diffused and triplet excitation energy is transferred to the fluorescent layer to be decayed, so that a significant decrease in emission efficiency is caused.

In view of the above, an object of one embodiment of the present invention is to provide a light-emitting element that has favorable emission efficiency despite a structure in which a fluorescent layer and a phosphorescent layer are stacked. Another object of one embodiment of the present invention is to provide a light-emitting device that can have low power consumption by using the light-emitting element. Another object of one embodiment of the present invention is to provide an electronic appliance and a lighting device that can have low power consumption by using the light-emitting element. Another object of one embodiment of the present invention is to provide a novel light-emitting element, a novel light-emitting device, a novel lighting device, or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting element that includes, between a pair of electrodes, an EL layer that includes a light-emitting layer having at least a stacked-layer structure of a first light-emitting layer emitting fluorescent light and a second light-emitting layer emitting phosphorescent light. The second light-emitting layer includes at least a plurality of layers in which exciplexes are formed. The layers in which the exciplexes are formed form a stacked-layer structure in which one layer is sandwiched between and in contact with two layers and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The second light-emitting layer includes a plurality of layers containing substances forming exciplexes and phosphorescent substances. The plurality of layers form a stacked-layer structure in which one layer is sandwiched between and in contact with two layers and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The second light-emitting layer includes a plurality of layers containing substances forming exciplexes and phosphorescent substances. The plurality of layers form a stacked-layer structure in which one layer is sandwiched between and in contact with two layers formed using the same material and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The second light-emitting layer includes a plurality of layers containing substances forming exciplexes and phosphorescent substances. The plurality of layers contain one or more common organic compounds and form a stacked-layer structure in which one layer is sandwiched between and in contact with two layers and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The first light-emitting layer contains a fluorescent substance, and the second light-emitting layer includes a plurality of layers containing phosphorescent substances. The layers containing the phosphorescent substances form a stacked-layer structure in which one layer is sandwiched between and in contact with two layers and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The first light-emitting layer contains a fluorescent substance and a host material whose T1 level is lower than that of the fluorescent substance, and the second light-emitting layer includes a plurality of layers containing substances forming exciplexes and phosphorescent substances. The plurality of layers form a stacked-layer structure in which one layer is sandwiched between and in contact with two layers and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The first light-emitting layer contains a fluorescent substance and a host material whose T1 level is lower than that of the fluorescent substance, and the second light-emitting layer includes a plurality of layers containing substances forming exciplexes and phosphorescent substances. The plurality of layers form a stacked-layer structure in which one layer is sandwiched between and in contact with two layers formed using the same material and emits light with an emission peak wavelength longer than those of light emitted from the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The first light-emitting layer contains a fluorescent substance and a host material whose T1 level is lower than that of the fluorescent substance, and the second light-emitting layer includes a plurality of layers containing substances forming exciplexes and phosphorescent substances. The plurality of layers contain one or more common organic compounds and form a stacked-layer structure in which one layer is sandwiched between and in contact with two layers and emits light with an emission peak wavelength longer than those of the two layers.

Another embodiment of the present invention is a light-emitting element that includes, between a pair of electrodes, an EL layer that includes a light-emitting layer having at least a stacked-layer structure in which a first light-emitting layer emitting fluorescent light and a second light-emitting layer emitting phosphorescent light are in contact with each other. The first light-emitting layer contains a fluorescent substance and a host material whose T1 level is lower than that of the fluorescent substance, and the second light-emitting layer includes a plurality of layers containing phosphorescent substances. The layers containing the phosphorescent substances form a stacked-layer structure in which one layer is sandwiched between and in contact with two layers and emits light with an emission peak wavelength longer than those of light emitted from the two layers.

Another embodiment of the present invention is a light-emitting device that includes the light-emitting element having any of the above-described structures.

Other embodiments of the present invention are not only a light-emitting device including the light-emitting element but also an electronic appliance and a lighting device each including the light-emitting device. The light-emitting device in this specification refers to an image display device and a light source (e.g., a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a light-emitting element by a chip on glass (COG) method.

One embodiment of the present invention can provide a light-emitting element that has favorable emission efficiency despite a structure in which a fluorescent layer and a phosphorescent layer are stacked. Another embodiment of the present invention can provide a light-emitting device that can have low power consumption by using the light-emitting element. Another embodiment of the present invention can provide an electronic appliance and a lighting device that can have low power consumption by using the light-emitting element. Another embodiment of the present invention can provide a novel light-emitting element, a novel light-emitting device, a novel lighting device, and the like. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 3A to 3D, 3D'1, and 3D'2 illustrate electronic appliances.

FIGS. 5A and 5B illustrate structures of a light-emitting element 1 and a comparative light-emitting element 2.

BEST MODE FOR CARRYING OUT THE INVENTION

Embodiments of the present invention will be described in detail with reference to the drawings. Note that the present invention is not limited to the following description, and various changes and modifications can be made without departing from the spirit and scope of the present invention. Therefore, the present invention should not be construed as being limited to the description in the following embodiments.

(Embodiment 1)

In this embodiment, a light-emitting element of one embodiment of the present invention is described.

In the light-emitting element of one embodiment of the present invention, an EL layer including a light-emitting layer is provided between a pair of electrodes. The light-emitting layer includes a light-emitting layer (I) that emits fluorescent light and a light-emitting layer (II) that emits phosphorescent light. Note that even when the light-emitting element does not include a charge-generation layer between the light-emitting layer (I) and the light-emitting layer (II) (i.e., even when the light-emitting element is not a tandem element), both fluorescence and phosphorescence can be obtained efficiently. An element structure of the light-emitting element of one embodiment of the present invention is described in detail below with reference to FIG. 1.

Figure 1:
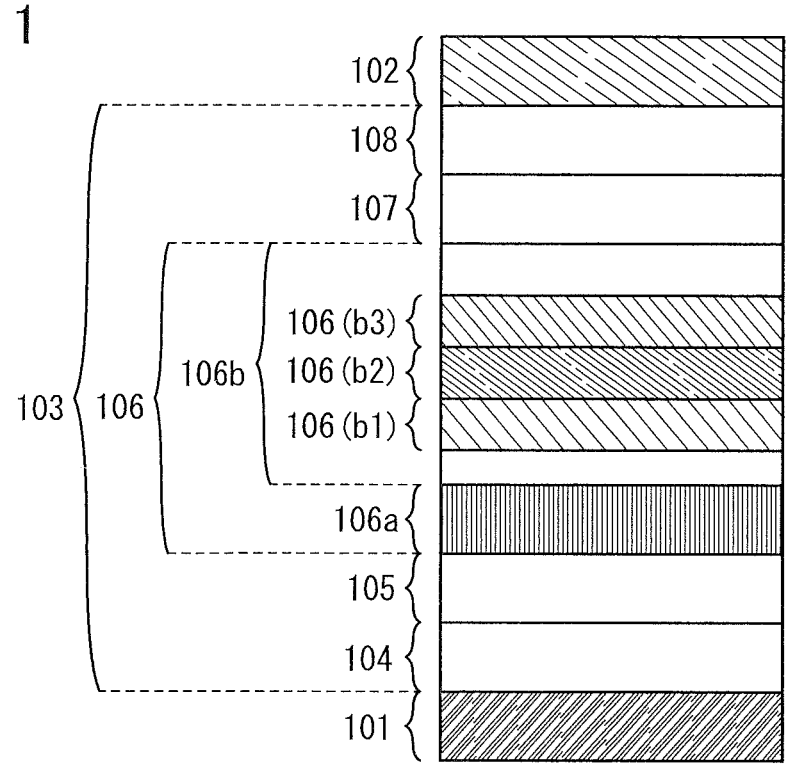
FIG. 1 illustrates a structure of a light-emitting element of one embodiment of the present invention.

In a light-emitting element illustrated in FIG. 1, an EL layer 103 that includes a light-emitting layer 106 is provided between a pair of electrodes (a first electrode 101 and a second electrode 102). The EL layer 103 has a structure in which a hole-injection layer 104, a hole-transport layer 105, a light-emitting layer 106, an electron-transport layer 107, an electron-injection layer 108, and the like are sequentially stacked over the first electrode (anode) 101 in this order. The light-emitting layer 106 has a structure in which a light-emitting layer (I) 106a and a light-emitting layer (II) 106b are stacked. Note that the stacking order of the light-emitting layer (I) 106a and the light-emitting layer (II) 106b is not particularly limited and can be changed as appropriate.

The light-emitting layer (I) 106a contains a fluorescent substance and host materials (organic compounds). Triplet excitons of the host materials are efficiently converted into singlet excitons by triplet-triplet annihilation (TTA), and fluorescent light is emitted from the fluorescent substance by energy transfer from singlet excitons.

Specifically, in the light-emitting layer (I) 106a, the lowest triplet excitation energy level (T1 level) of the host material is preferably lower than that of the fluorescent substance. The proportion of host materials is generally much higher than that of fluorescent substances in the light-emitting layer. When the host material and the fluorescent substance are used in combination such that the T1 level of the host material becomes lower than that of the fluorescent substance, a decrease in the probability of collision between triplet excitons, which is caused when the triplet excitons generated in the light-emitting layer (I) 106a are trapped by few fluorescent substances (molecules) in the light-emitting layer (I) 106a and localized, can be prevented, leading to an increase in the probability of TTA. Thus, the emission efficiency of fluorescence of the light-emitting layer (I) 106a can be increased. Note that as the fluorescent substance used in the light-emitting layer (I) 106a, known substances that emit blue light (with an emission spectrum peak wavelength in the range of 400 nm to 480 nm), green light (with an emission spectrum peak wavelength in the range of 500 nm to 560 nm), red light (with an emission spectrum peak wavelength in the range of 580 nm and 680 nm), orange light, yellow light, and the like can be used as appropriate.

The light-emitting layer (II) 106b has a structure in which at least three different layers, a first layer 106(b1), a second layer 106(b2), and a third layer 106(b3), are stacked as illustrated in FIG. 1. These three layers each contain two kinds of organic compounds that can form an excited complex (hereinafter, exciplex) and a phosphorescent substance. The emission wavelength of a formed exciplex in each layer is longer than the emission wavelength (fluorescence wavelength) of each of the organic compounds forming the exciplex; thus, the fluorescent spectra of the organic compounds can be converted into emission spectra on the longer wavelength side, so that drive voltage can be reduced. In addition, energy can be transferred from the exciplex to the phosphorescent substance, so that high emission efficiency can be obtained. Note that the light-emitting layer (II) 106b may include a layer that does not contain a phosphorescent substance but contains an organic compound, in addition to the above-described three layers.

Furthermore, the three layers are formed such that the emission peak wavelength of phosphorescence from the second layer 106(b2) becomes longer than those of phosphorescence from the first layer 106(b1) and the third layer 106(b3).

Specifically, as a second phosphorescent substance used in the second layer 106 (b2), a substance having an emission peak wavelength longer than those of a first phosphorescent substance used in the first layer 106(b1) and a third phosphorescent substance used in the third layer 106(b3). Note that as the phosphorescent substances used in the three layers in the light-emitting layer (II) 106b, known substances that emit blue light (with an emission spectrum peak wavelength in the range of 400 nm to 480 nm), green light (with an emission spectrum peak wavelength in the range of 500 nm to 560 nm), red light (with an emission spectrum peak wavelength in the range of 580 nm and 680 nm), orange light, yellow light, and the like can be used as appropriate in accordance with the above-described structure.

Note that by employing such a structure for the light-emitting layer (II) 106b, the energy of an exciplex formed in the second layer 106(b2) can be efficiently transferred to the phosphorescent substance that has the longest emission peak wavelength, and diffusion of excitons to the other layers can be suppressed, so that the emission efficiency of phosphorescence in the light-emitting layer (II) 106b can be increased. Note that although the light-emitting layer (II) 106b may consist of only the above-described three layers, it may further include a layer that does not contain a phosphorescent substance but contains two kinds of organic compounds that can form an exciplex.

As the organic compound used as a host material or the like in the light-emitting layer (I) 106a and the light-emitting layer (II) 106b, which is different from the phosphorescent substance and the phosphorescent substance, electron-transport materials with an electron mobility of $10^{-6}$ cm$^2$/Vs or higher and hole-transport materials with a hole mobility of $10^{-6}$ cm$^2$/Vs or higher can be mainly given. Note that for the layers containing the phosphorescent substances in the light-emitting layer (II) 106b, two or more kinds of the above-described organic compounds are selected for each layer such that an exciplex can be formed.

By dispersing the light-emitting substance (the fluorescent substance or the phosphorescent substance) to the organic compounds in the light-emitting layer (I) 106a or the light-emitting layer (II) 106b, crystallization in the light-emitting layer can be suppressed. Furthermore, it is possible to suppress concentration quenching due to high concentration of the light-emitting substance; thus, the emission efficiency of the light-emitting element can be increased.

The T1 level of the organic compound is preferably higher than that of the phosphorescent substance in the light-emitting layer (II) 106b for the following reason. When the T1 level of an electron-transport material or a hole-transport material is lower than that of the phosphorescent substance, the triplet excitation energy of the phosphorescent substance that contributes to light emission is quenched by the electron-transport material or the hole-transport material, which leads to a reduction in emission efficiency.

By fabricating a light-emitting element that satisfies the above-described conditions, a light-emitting element that can emit fluorescent light and phosphorescent light can be obtained. Examples of combinations of colors of fluorescent light emitted from the light-emitting layer (I) 106a and phosphorescent light emitted from the light-emitting layer (II) 106b, which are represented by "color of fluorescent light emitted from the light-emitting layer (I) 106a\color of phosphorescent light emitted from the light-emitting layer (II) 106b", include "blue\green•red•green", "blue\blue•red•green", "blue\yellow•red•green", "blue\green•red•yellow", "blue\yellow•red•yellow", "green\green•red•green", "green\blue•red•green", "green\yellow•red•green", "green\green•red•yellow", "green\yellow•red•yellow", "red\green•red•green", "red\blue•red•green", "red\yellow•red•green", "red\green•red•yellow", and "red\yellow•red•yellow". Note that the above-described combinations are possible even when the light-emitting layer (I) 106a and the light-emitting layer (II) 106b are stacked in reverse order.

When a fluorescent layer and a phosphorescent layer are stacked, triplet excitation energy generated in the phosphorescent layer is generally transferred to a host material in the fluorescent layer to cause non-radiative decay, which results in reduced emission efficiency. However, in the light-emitting element of one embodiment of the present invention, triplet excitation energy of an exciplex formed in the phosphorescent layer is transferred to the phosphorescent substance, so that light emission is obtained. In addition, an exciton is unlikely to be diffused from the exciplex to a substance other than the phosphorescent substance. Thus, phosphorescence as well as fluorescence can be efficiently obtained. Note that in one embodiment of the present invention, a singlet excited state can be easily formed by TTA in the light-emitting layer (I) 106a, which enables triplet excitation energy from an exciplex formed in the light-emitting layer (II) 106b to be converted into fluorescence even when transfer of the triplet excitation energy occurs.

Figure 12:
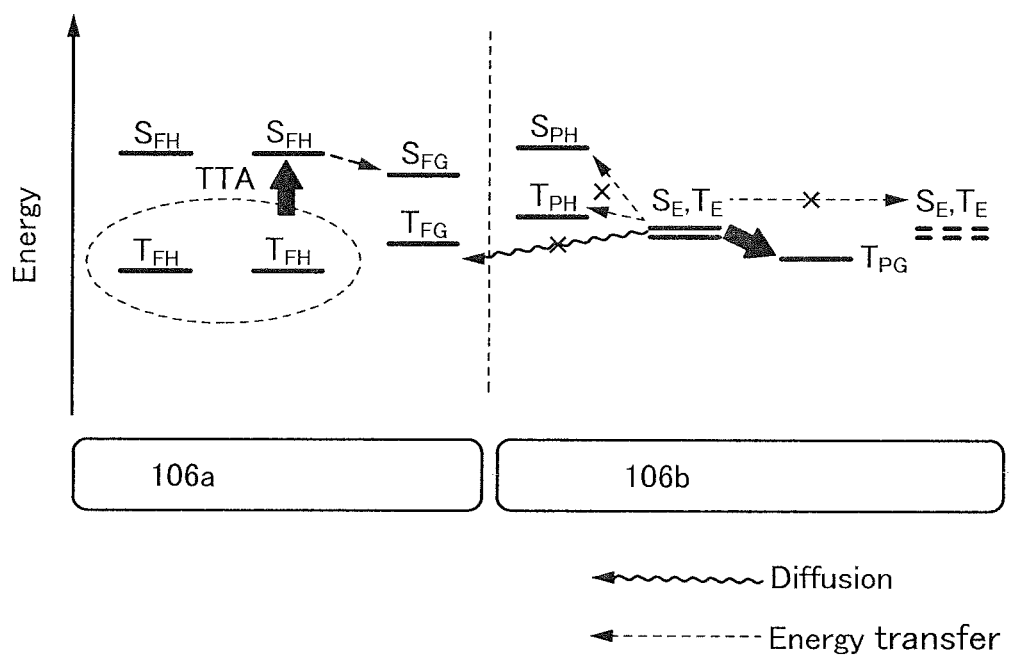
FIG. 12 shows the correlation of energy levels in light-emitting layers.

FIG. 12 shows the correlation between energy levels of substances and an exciplex in the light-emitting element. In FIG. 12, $S_{FH}$ represents a singlet excitation level of a host material in the light-emitting layer (1) 106a; $T_{FH}$, a triplet excitation level of the host material in the light-emitting layer (I) 106a; $S_{FG}$, a singlet excitation level of a guest material (a fluorescent substance) in the light-emitting layer (I) 106a; $T_{FG}$, a triplet excitation level of the guest material (the fluorescent substance in the light-emitting layer (I) 106a; $S_{PH}$, a singlet excitation level of a host material (a first organic compound or a second organic compound) in the light-emitting layer (II) 106b; $T_{PH}$, a triplet excitation level of the host material (the first organic compound or the second organic compound) in the light-emitting layer (II) 106b; SE, a singlet excitation level of an exciplex in the light-emitting layer (II) 106b; $T_E$, a triplet excitation level of the exciplex in the light-emitting layer (II) 106b; and $T_{PG}$, a triplet excitation level of a guest material (a phosphorescent substance) in the light-emitting layer (II) 106b.

As shown in FIG. 12, TTA occurs because of collision between triplet excited molecules of the host materials in the light-emitting layer (I) 106a and some of the triplet excited molecules of the host material are converted into singlet excited molecules while some of the triplet excited molecules are thermally decayed. Then, the energy of the singlet excited state ($S_{FG}$) of the host material that is generated by TTA is transferred to the singlet excited state of the fluorescent substance, and the singlet excitation energy is converted into fluorescence.

In the light-emitting layer (II) 106b, the excitation levels ($S_E$ and $T_E$) of the exciplex are lower than the excitation levels ($S_{PH}$ and $T_{PH}$) of the host materials (the first organic compound and the second organic compound); thus, excitation energy transfer from the exciplex to the host material does not occur. In addition, energy transfer from the exciplex to another exciplex does not occur. When the excitation energy of the exciplex is transferred to the guest material (the phosphorescent substance), the excitation energy can be converted into light emission. As described above, the triplet excitation energy is hardly diffused and can be converted into light emission in the light-emitting layer (II) 106b.

Thus, light emission can be obtained with favorable efficiency from both of the light-emitting layer (I) 106a and the light-emitting layer (II) 106b even when a little energy transfer (e.g., energy transfer from $T_{PG}$ of the phosphorescent substance at the interface between the light-emitting layer (I) 106a and the light-emitting layer (II) 106b to $T_{FH}$ or $T_{FG}$) occurs at the interface. Since the singlet excited state is generated by the triplet excitation energy through TTA in the light-emitting layer (I) 106a, even when energy transfer occurs at the interface, part of transferred energy is converted into fluorescence. This can suppress loss of the energy.

Next, a specific example in fabrication of the above light-emitting element is described.

As the first electrode (anode) 101 and the second electrode (cathode) 102, a metal, an alloy, an electrically conductive compound, a mixture thereof, and the like can be used. Specifically, indium oxide-tin oxide (indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, that is, an alkali metal such as lithium (Li) or cesium (Cs), an alkaline earth metal such as calcium (Ca) or strontium (Sr), magnesium (Mg), an alloy containing such an element (e.g., MgAg or AlLi), a rare earth metal such as europium (Eu) or ytterbium (Yb), an alloy containing such an element, graphene, and the like can be used. The first electrode (anode) 101 and the second electrode (cathode) 102 can be formed by, for example, a sputtering method or an evaporation method (including a vacuum evaporation method).

The hole-injection layer 104 injects holes into the light-emitting layer 106 through the hole-transport layer 105 with a high hole-transport property. The hole-injection layer 104 contains a hole-transport material and an acceptor substance, so that electrons are extracted from the hole-transport material by the acceptor substance to generate holes and the holes are injected into the light-emitting layer 106 through the hole-transport layer 105. The hole-transport layer 105 is formed using a hole-transport material.

Specific examples of the hole-transport material, which is used for the hole-injection layer 104 and the hole-transport layer 105, include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Other examples include carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances listed here are mainly ones that have a hole mobility of $10^{-6}$ cm$^2$/Vs or higher. Note that any substance other than the substances listed here may be used as long as the hole-transport property is higher than the electron-transport property.

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine] (abbreviation: Poly-TPD).

Examples of the acceptor substance that is used for the hole-injection layer 104 include oxides of metals belonging to Groups 4 to 8 of the periodic table. Specifically, molybdenum oxide is particularly preferable.

The light-emitting layer 106 is a stack of the light-emitting layer (I) 106a and the light-emitting layer (II) 106b, each of which has the above-described structure.

As examples of the fluorescent substance that is used in the light-emitting layer (I) 106a, substances that convert singlet excitation energy into light emission are given.

Examples of the fluorescent substance include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,-tetrakis(4-methylphenyl)acenaphtho[1,2]fluoranthene-3,10-diamine (abbreviation: p-mPhAFD), {2-isopropyl-6-[2-(1,1,7,7-tetramethyl-2,3, 6,7-tetrahydro-1H, 5H-benzo[i]quinolizin-9-yl)ethenyl]-4H-pyran-4-ylidene}propanedinitrile (abbreviation: DCJTI), 12-tert-butyl-6-[2-(1,1,7,7-tetramethyl-2,3, 6, 7-tetrahydro-1H,5H-benzo[ij]quinolizin-9-yl)ethenyl]-4H-pyran-4-ylidene propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), and 2-{2,6-b is [2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

As examples of the phosphorescent substance that is used for the light-emitting layer (II) 106b, substances that convert triplet excitation energy into light emission are given.

The examples include bis {2-[3',5'-bis(trifluoromethyl)phenyl]pyridinato-N,C$^{2'}$}iridium(III) picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$ (Phen)), bis(benzo[h]quinolinato)iridium(III) acetylacetonate (abbreviation: Ir(bzq)$_2$(acac)), bis(2,4-diphenyl-1,3-oxazolato-N,C$^2$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), bis(2-phenylbenzothiazolato-N,C$^{2'}$)iridium (III) acetylacetonate (abbreviation: Ir(bt)$_2$(acac)), bis[2-(2'-benzo[4,5-a]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$ (acac)), (acetylacetonato)bis(3,5-dimethyl-2-phenylpyrazinato)iridium(III) (abbreviation: [Ir(mppr-Me)$_2$ (acac)]), (acetylacetonato)bis(5-isopropyl-3-methyl-2-phenylpyrazinato)iridium(III) (abbreviation: [Ir(mppr-iPr)$_2$ (acac)]), (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(III) (abbreviation: [Ir(tppr)$_2$(dpm)], (acetylacetonato)bis(6-tert-butyl-4-phenylpyrimidinato)iridium (III) (abbreviation: [Ir(tBuppm)$_2$(acac)]), (acetylacetonato)bis(4,6-diphenylpyrimidinato)iridium(III) (abbreviation: [Ir(dppm)$_2$(acac)]), 2,3,7,8,12,13,17,18-octaethyl-21H,23H-porphyrin platinum (II) (abbreviation: PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Note that a thermally activated delayed fluorescence (TADF) material that exhibits thermally activated delayed fluorescence can be used instead of the phosphorescent substances. Note that "delayed fluorescence" exhibited by the TADF material refers to light emission having the same emission spectrum as normal fluorescence and an extremely long lifetime. The lifetime is $10^{-6}$ seconds or longer, preferably $10^{-3}$ seconds or longer.

Specific examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP). Alternatively, a heterocyclic compound including a π-electron rich heteroaromatic ring and a π-electron deficient heteroaromatic ring can be used, such as 2-(biphenyl-4-yl)-4, 6-bis(12-phenylindolo[2,3-a]carbazol-11-yl)-1,3,5-triazine (PIC-TRZ). Note that a material in which the π-electron rich heteroaromatic ring is directly bonded to the π-electron deficient heteroaromatic ring is particularly preferably used because both the donor property of the π-electron rich heteroaromatic ring and the acceptor property of the π-electron deficient heteroaromatic ring are increased and the energy difference between the S1 level and the T1 level becomes small.

Examples of the organic compound used for the light-emitting layer (I) 106a include anthracene compounds such as 9-phenyl-3-[4-(10-phenyl-9-anthryl)phenyl]-9H-carbazole (abbreviation: PCzPA), 9-[4-(10-phenyl-9-anthryl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Note that the use of a substance having an anthracene skeleton as the host material enables a light-emitting layer that has high emission efficiency and durability to be provided. In particular, CzPA, cgDBCzPA, 2mBnfPPA, and PCzPA are preferable because of their high characteristics.

As the electron-transport material, which is an organic compound, used for the light-emitting layer (II) 106b, a π-electron deficient heteroaromatic compound such as a nitrogen-containing heteroaromatic compound is preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[a]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[a]quinoxaline (abbreviation: 6mDBTPDBq-II).

As the hole-transport material, which is an organic compound, used for the light-emitting layer (II) 106b, a π-electron rich heteroaromatic compound (e.g., a carbazole derivative or an indole derivative) or an aromatic amine compound is preferable, examples of which include 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: F-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yephenyl)-N-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2)

The electron-transport layer 107 is a layer that contains a substance having an high electron-transport property. For the electron-transport layer 107, it is possible to use a metal complex such as Alga, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$). A heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butyl phenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used. The substances listed here are mainly ones that have an electron mobility of $10^{-6}$ cm$^2$/Vs or higher. Note that any substance other than the substances listed here may be used for the electron-transport layer 107 as long as the electron-transport property is higher than the hole-transport property.

The electron-transport layer 107 is not limited to a single layer, but may be a stack of two or more layers each containing any of the substances listed above.

The electron-injection layer 108 is a layer that contains a substance having a high electron-injection property. For the electron-injection layer 108, an alkali metal, an alkaline earth metal, or a compound thereof such as lithium fluoride (LiF), cesium fluoride (CsF), calcium fluoride (CaF$_2$), or lithium oxide (LiO$_x$) can be used. A rare earth metal compound like erbium fluoride (ErF$_3$) can also be used. An electride may also be used for the electron-injection layer 108. Examples of the electride include a substance in which electrons are added at high concentration to calcium oxide-aluminum oxide. Any of the substances for forming the electron-transport layer 107, which are listed above, can be used.

A composite material in which an organic compound and an electron donor (donor) are mixed may also be used for the electron-injection layer 108. The composite material is superior in an electron-injection property and an electron-transport property, since electrons are generated in the organic compound by the electron donor. In this case, the organic compound is preferably a material that is excellent in transporting the generated electrons. Specifically, for example, the substances for forming the electron-transport layer 107 (e.g., a metal complex or a heteroaromatic compound), which are given above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, and ytterbium are given. In addition, an alkali metal oxide or an alkaline earth metal oxide is preferable, and lithium oxide, calcium oxide, and barium oxide are given. A Lewis base such as magnesium oxide can also be used. An organic compound such as tetrathiafulvalene (abbreviation: TTF) can also be used.

Note that each of the hole-injection layer 104, the hole-transport layer 105, the light-emitting layer 106 (the light-emitting layer (I) 106a and the light-emitting layer (II) 106b), the electron-transport layer 107, and the electron-injection layer 108 can be formed by a method such as an evaporation method (e.g., a vacuum evaporation method), an ink jet method, or a coating method.

In the above-described light-emitting element, carriers are injected because of a potential difference generated between the first electrode 101 and the second electrode 102, and the holes and the electrons are recombined in the EL layer 103, whereby light is emitted. Then, the emitted light is extracted outside through one or both of the first electrode 101 and the second electrode 102. Thus, one or both of the first electrode 101 and the second electrode 102 are electrodes having light-transmitting properties.

A light-emitting element having the structure described in this embodiment can emit fluorescent light and phosphorescent light, particularly emit phosphorescent light with high efficiency, which increases the emission efficiency of the whole light-emitting element.

Note that the structure described in this embodiment can be combined as appropriate with any of the structures described in the other embodiments.

(Embodiment 2)

In this embodiment, as an example of a light-emitting device including the light-emitting element of one embodiment of the present invention, an active matrix light-emitting device is described with reference to FIGS. 2A and 2B. Note that the light-emitting element described in embodiment 1 can be used for the light-emitting device described in this embodiment.

Figure 2A:
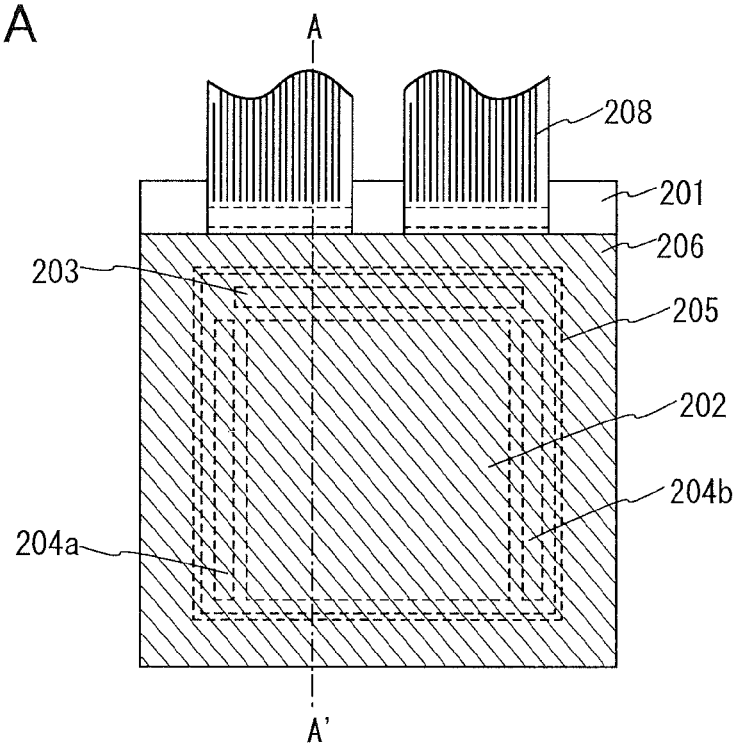
FIGS. 2A and 2B illustrate a light-emitting device.
Figure 2B:
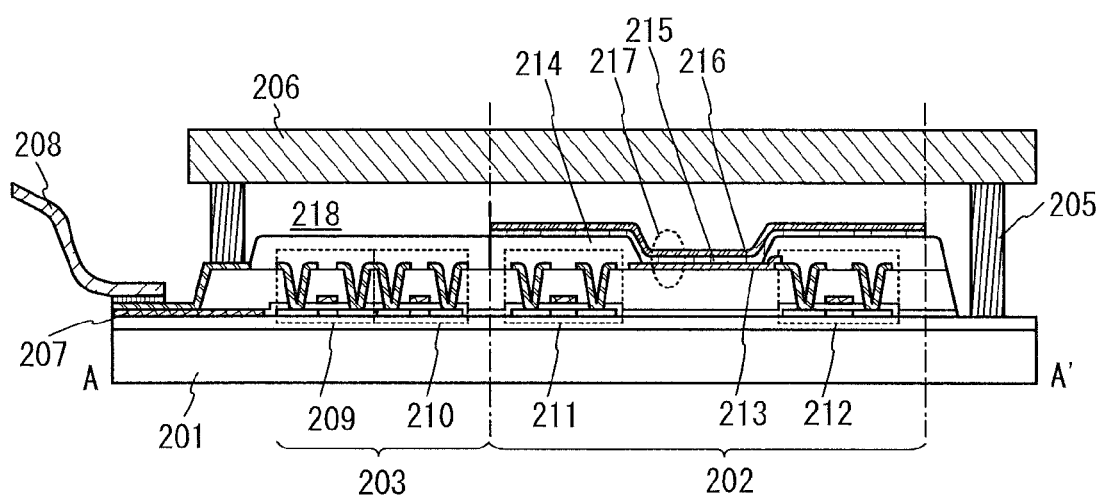

FIG. 2A is a top view illustrating the light-emitting device and FIG. 2B is a cross-sectional view taken along the dashed line A-A' in FIG. 2A. The active matrix light-emitting device of this embodiment includes, over an element substrate 201, a pixel portion 202, a driver circuit portion (a source line driver circuit) 203, and driver circuit portions (gate line driver circuits) 204a and 204b. The pixel portion 202, the driver circuit portion 203, and the driver circuit portions 204a and 204b are sealed between the element substrate 201 and a sealing substrate 206 with a sealant 205.

In addition, over the element substrate 201, a lead wiring 207 for connecting an external input terminal that transmits a signal (e.g., a video signal, a clock signal, a start signal, or a reset signal) or an electric potential to the driver circuit portion 203 and the driver circuit portions 204a and 204b is provided. Here, an example is shown in which a flexible printed circuit (FPC) 208 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 2B. The driver circuit portion and the pixel portion are formed over the element substrate 201; the driver circuit portion 203 that is the source line driver circuit and the pixel portion 202 are illustrated here.

The driver circuit portion 203 is an example in which an FET 209 and an FET 210 are combined. Note that each of the FET 209 and the FET 210 included in the driver circuit portion 203 may be formed with a circuit including transistors having the same conductivity type (either an n-channel transistor or a p-channel transistor) or a CMOS circuit including an n-channel transistor and a p-channel transistor. Although a driver integrated type in which the driver circuit is formed on the substrate is described in this embodiment, the driver circuit may not necessarily be formed on the substrate, and may be formed outside the substrate.

The pixel portion 202 includes a plurality of pixels each of which includes a switching FET 211, a current control FET 212, and a first electrode (anode) 213 that is electrically connected to a wiring (a source electrode or a drain electrode) of the current control FET 212. Although the pixel portion 202 includes two FETs, the switching FET 211 and the current control FET 212, in this embodiment, one embodiment of the present invention is not limited thereto. The pixel portion 202 may include, for example, three or more FETs and a capacitor in combination.

As the FETs 209, 210, 211, and 212, for example, a staggered transistor or an inverted staggered transistor can be used. Examples of a semiconductor material that can be used for the FETs 209, 210, 211, and 212 include Group IV semiconductors (e.g., silicon), Group III semiconductors (e.g., gallium), compound semiconductors, oxide semiconductors, and organic semiconductors. In addition, there is no particular limitation on the crystallinity of the semiconductor material, and an amorphous semiconductor or a crystalline semiconductor can be used. In particular, an oxide semiconductor is preferably used for the FETs 209, 210, 211, and 212. Examples of the oxide semiconductor include an In—Ga oxide and an In-M-Zn oxide (M is Al, Ga, Y, Zr, La, Ce, or Nd). For example, an oxide semiconductor material that has an energy gap of 2 eV or more, preferably 2.5 eV or more, further preferably 3 eV or more is used for the FETs 209, 210, 211, and 212, so that the off-state current of the transistors can be reduced.

An insulator 214 is formed to cover edge portions of the first electrode 213. In this embodiment, the insulator 214 is formed using a positive photosensitive acrylic resin. The first electrode 213 is used as an anode in this embodiment.

The insulator 214 preferably has a curved surface with curvature at an upper end portion or a lower end portion thereof. This enables the coverage with a film to be formed over the insulator 214 to be favorable. The insulator 214 can be formed using, for example, either a negative photosensitive resin or a positive photosensitive resin. The material of the insulator 214 is not limited to an organic compound and an inorganic compound such as silicon oxide, silicon oxynitride, or silicon nitride can also be used.

An EL layer 215 and a second electrode (cathode) 216 are stacked over the first electrode (anode) 213. In the EL layer 215, at least a light-emitting layer is provided, and the light-emitting layer has the stacked-layer structure described in Embodiment 1. In the EL layer 215, a hole-injection layer, a hole-transport layer, an electron-transport layer, an electron-injection layer, a charge-generation layer, and the like can be provided as appropriate in addition to the light-emitting layer.

A light-emitting element 217 is formed of a stack of the first electrode (anode) 213, the EL layer 215, and the second electrode (cathode) 216. For the first electrode (anode) 213, the EL layer 215, and the second electrode (cathode) 216, any of the materials listed in Embodiment 1 can be used.

Although not illustrated, the second electrode (cathode) 216 is electrically connected to the FPC 208 that is an external input terminal.

Although the cross-sectional view of FIG. 2B illustrates only one light-emitting element 217, a plurality of light-emitting elements including the light-emitting element of one embodiment of the present invention are arranged in matrix in the pixel portion 202. Light-emitting elements that emit light of three kinds of colors (R, G and B) are selectively formed in the pixel portion 202, whereby a light-emitting device capable of full color display can be obtained. In addition to the light-emitting elements that emit light of three kinds of colors (R, G, and B), for example, light-emitting elements that emit light of white (W), yellow (Y), magenta (M), cyan (C), and the like may be formed. For example, the light-emitting elements that emit light of a plurality of kinds of colors are used in combination with the light-emitting elements that emit light of three kinds of colors (R, G, and B), whereby effects such as an improvement in color purity and a reduction in power consumption can be obtained. A micro optical resonator (microcavity) structure in which a light resonant effect between electrodes is utilized may be employed in order to narrow a line width of each emission color. A light-emitting device that is capable of full color display may also be fabricated by a combination with color filters. Furthermore, a light-emitting element in which a tandem structure and the structure of the light-emitting element of one embodiment of the present invention are combined may be used.

Furthermore, the sealing substrate 206 is attached to the element substrate 201 with the sealant 205, whereby a light-emitting element 217 is provided in a space 218 surrounded by the element substrate 201, the sealing substrate 206, and the sealant 205. The space 218 may be filled with an inert gas (such as nitrogen or argon), or the sealant 205.

An epoxy-based resin or glass frit is preferably used for the sealant 205. The material preferably allows as little moisture and oxygen as possible to penetrate. As the sealing substrate 206, a glass substrate, a quartz substrate, or a plastic substrate formed of fiber-reinforced plastic (FRP), poly(vinyl fluoride) (PVF), polyester, acrylic, or the like can be used. In the case where glass frit is used as the sealant, the element substrate 201 and the sealing substrate 206 are preferably glass substrates for high adhesion.

As described above, the active matrix light-emitting device can be fabricated. Note that the active matrix light-emitting device is described as an example of a light-emitting device in this embodiment, a passive matrix light-emitting device in which the light-emitting element of one embodiment of the present invention, which is described in Embodiment 1, is used can be fabricated.

Note that there is no particular limitation on the structure of the transistor (FET) in the case of fabricating the active matrix light-emitting device. For example, a staggered FET or an inverted staggered FET can be used as appropriate. A driver circuit formed over a FET substrate may be formed of both an n-type FET and a p-type FET or only either an n-type FET or a p-type FET. Furthermore, there is no particular limitation on the crystallinity of a semiconductor film used for the FET. For example, either an amorphous semiconductor film or a crystalline semiconductor film can be used. Examples of a semiconductor material include Group IV semiconductors (e.g., silicon), Group III semiconductors (e.g., gallium), compound semiconductors (including oxide semiconductors), and organic semiconductors.

Note that the structure described in this embodiment can be combined as appropriate with any of the structures described in the other embodiments.

(Embodiment 3)

In this embodiment, examples of a variety of electronic appliances that are completed using a light-emitting device, which is fabricated using the light-emitting element of one embodiment of the present invention, are described with reference to FIGS. 3A to 3D, 3D'1, and 3D'2.

Examples of electronic appliances including the light-emitting device include television devices (also referred to as TV or television receivers), monitors for computers and the like, cameras such as digital cameras and digital video cameras, digital photo frames, mobile phones (also referred to as cellular phones or portable telephone devices), portable game machines, portable information terminals, audio playback devices, and large game machines such as pachinko machines. Specific examples of the electronic appliances are illustrated in FIGS. 3A to 3D, 3D'1, and 3D'2.

FIG. 3A illustrates an example of a television device. In the television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

FIG. 3B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

FIG. 3C illustrates a smart watch, which includes a housing 7302, a display panel 7304, operation buttons 7311 and 7312, a connection terminal 7313, a band 7321, a clasp 7322, and the like The display panel 7304 mounted in the housing 7302 serving as a bezel includes a non-rectangular display region. The display panel 7304 can display an icon 7305 indicating time, another icon 7306, and the like.

The smart watch illustrated in FIG. 3C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

FIG. 3D illustrates an example of a mobile phone (e.g., smartphone). A mobile phone 7400 includes a housing 7401 provided with a display portion 7402, a microphone 7406, a speaker 7405, a camera 7407, an external connection portion 7404, an operation button 7403, and the like. In the case where the light-emitting element of one embodiment of the present invention is formed over a flexible substrate, the light-emitting element can be used for the display portion 7402 having a curved surface as illustrated in FIG. 3D.

When the display portion 7402 of the mobile phone 7400 illustrated in FIG. 3D is touched with a finger or the like, data can be input to the mobile phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as text. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, when a backlight or a sensing light source that emits near-infrared light is provided in the display portion, an image of a finger vein, a palm vein, or the like can be taken.

Furthermore, the light-emitting device can be used for a mobile phone having a structure illustrated in FIG. 3D'1 or FIG. 3D'2, which is another structure of the mobile phone (e.g., smartphone).

Note that in the case of the structure illustrated in FIG. 3D'1 or FIG. 3D'2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the mobile phone is placed in user's breast pocket.

As described above, the electronic appliances can be obtained using the light-emitting device that includes the light-emitting element of one embodiment of the present invention. Note that the light-emitting device can be used for electronic appliances in a variety of fields without being limited to the electronic appliances described in this embodiment.

Note that the structure described in this embodiment can be combined as appropriate with any of the structures described in the other embodiments.

(Embodiment 4)

In this embodiment, examples of lighting devices in each of which a light-emitting device including the light-emitting element of one embodiment of the present invention is used are described with reference to FIG. 4.

Figure 4:
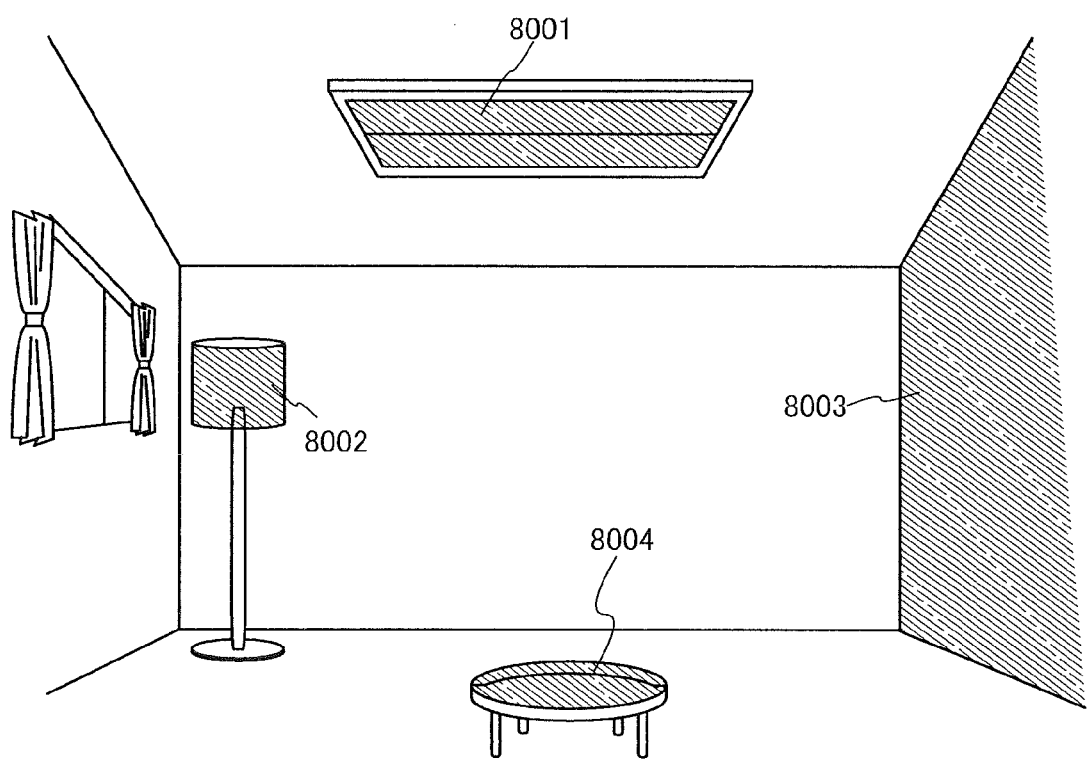
FIG. 4 illustrates lighting devices.

FIG. 4 illustrates an example in which the light-emitting device is used as an indoor lighting device 8001. Since the light-emitting device can have a large area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a table by being used as a surface of a table, a lighting device 8004 that has a function as a table can be obtained. When the light-emitting device is used as part of other furniture, a lighting device that functions as the furniture can be obtained.

As described above, a variety of lighting devices that include the light-emitting device can be obtained. Note that these lighting devices are also embodiments of the present invention.

Note that the structure described in this embodiment can be combined as appropriate with any of the structures described in the other embodiments.

EXAMPLE 1

In this example, a light-emitting element 1 as a light-emitting element of one embodiment of the present invention and a comparative light-emitting element 2 for comparison were fabricated, and characteristics of the light-emitting elements were compared.

Although both of the light-emitting element 1 and the comparative light-emitting element 2 have a light-emitting layer (I) emitting fluorescent light and a light-emitting layer (II) emitting phosphorescent light, the light-emitting elements have different structures of the light-emitting layers (II). Since the light-emitting elements have the same structure except for the structures of the light-emitting layers (II), the components of the light-emitting element 1 in FIG. 5A and the components of the comparative light-emitting element 2 in FIG. 5B are collectively described using the same reference numerals. Note that a light-emitting layer (II) 506$b$ of the light-emitting element 1 has a stacked-layer structure in which a third layer 506($b$3) formed between a second layer 506($b$2) and a fourth layer 506($b$4) emits light with an emission peak wavelength longer than those of light emitted from the second layer 506($b$2) and the fourth layer 506($b$4). Structural formulae and abbreviations of materials used in this example are shown below.

[Chemical Formulae 1]

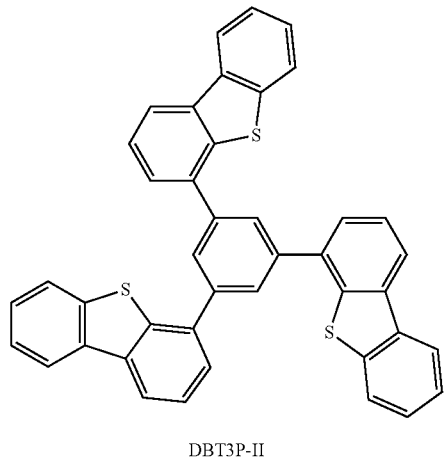

DBT3P-II

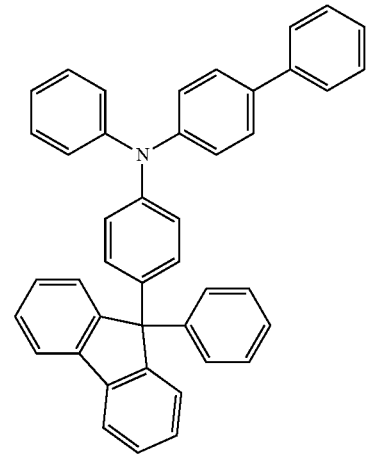

BPAFLP

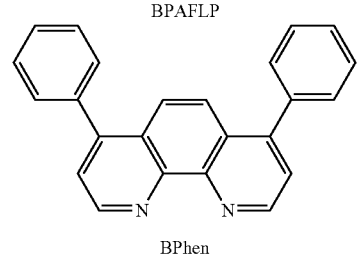

BPhen

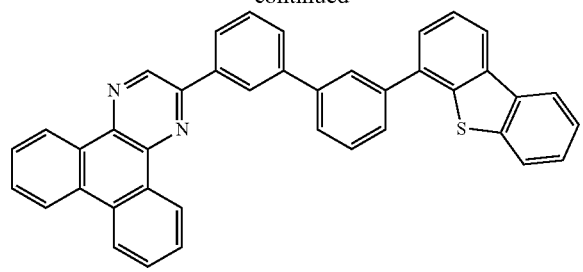
2mDBTBPDBq-II
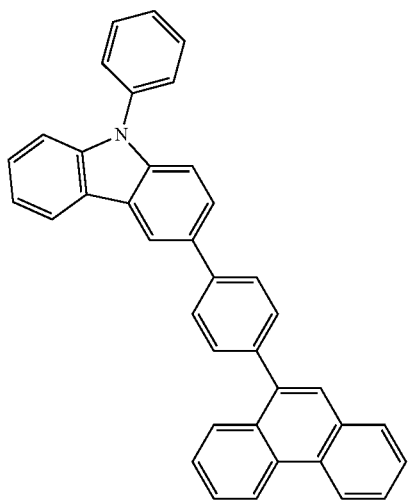
PCPPn
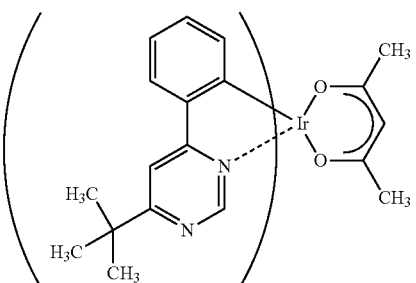
[Ir(tBuppm)₂(acac)]
[Chemical Formulae 2]
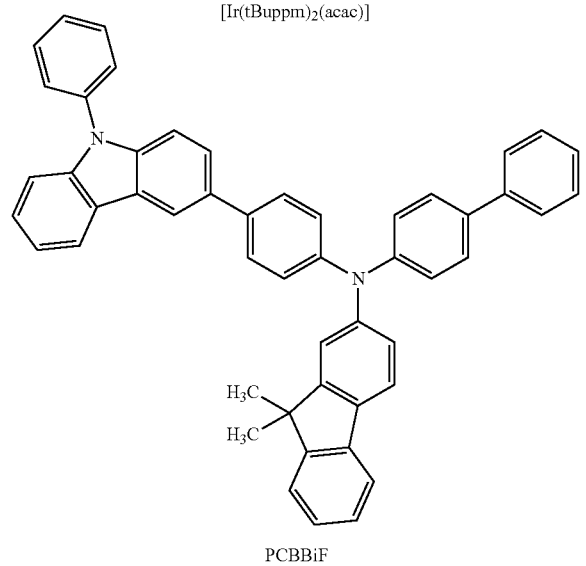
PCBBiF
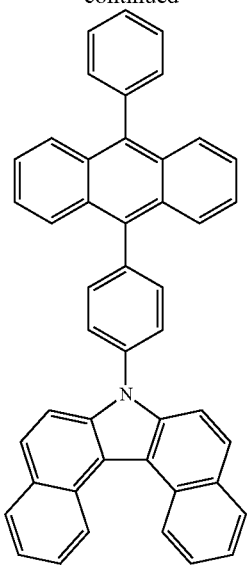
cgDBCzPA
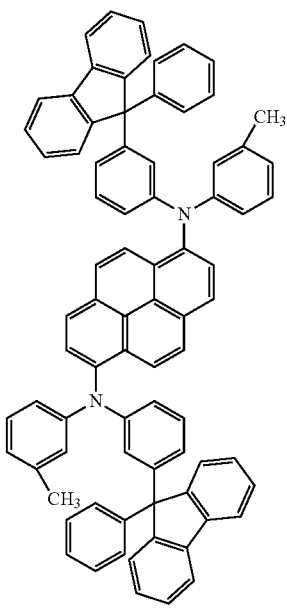
1,6mMemFLPAPm
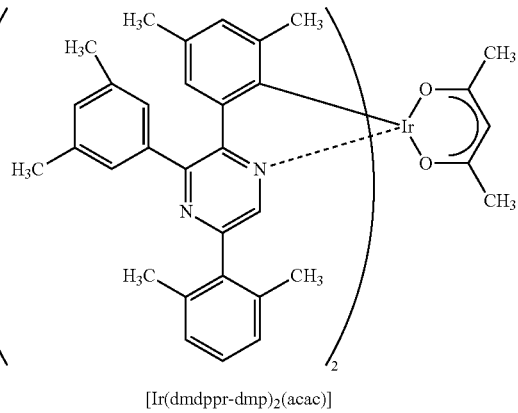
[Ir(dmdppr-dmp)₂(acac)]

<<Fabrication of Light-Emitting Element 1 and Comparative Light-Emitting Element 2>>

A first electrode 501 was an electrode functioning as an anode and formed in such a manner that indium tin oxide (ITO) was deposited to a thickness of 110 nm over a glass substrate 500 with a refractive index of 1.84 by a sputtering method. The electrode area was set to 2 mm×2 mm.

As pretreatment, the surface of the substrate 500 was washed with water and then subjected to UV ozone treatment for 370 seconds. After that, the substrate 500 was transferred into a vacuum evaporation apparatus where the pressure had been reduced to approximately $10^{-4}$ Pa, and was subjected to vacuum baking at 190° C. for 60 minutes in a heating chamber of the vacuum evaporation apparatus, and then the substrate 500 was cooled down for approximately 30 minutes.

An EL layer 503 and a second electrode 502 are sequentially formed over the first electrode 501. Note that as illustrated in FIG. 5A, the EL layer 503 in the light-emitting element 1 includes a hole-injection layer 504, a hole-transport layer 505, a light-emitting layer 506 (a light-emitting layer (I) 506a and a light-emitting layer (II) 506b), an electron-transport layer 507, and an electron-injection layer 508. The light-emitting layer (II) 506b has a stack of a plurality of layers (506(b1), 506(b2), 506(b3), and 506(b4)) containing different substances. As illustrated in FIG. 5B, the light-emitting layer 506 in the comparative light-emitting element 2 includes a light-emitting layer (II) 506b' having a structure different from that of the light-emitting layer (II) 506b in the light-emitting element 1. Thus, in this embodiment, parts that are the same in the light-emitting element 1 and the comparative light-emitting element 2 are collectively described, and only different parts are described individually.

After reducing the pressure of the vacuum evaporation apparatus to $10^{-4}$ Pa, 1,3,5-tri(dibenzothiophen-4-yl)benzene (abbreviation: DBT3P-II) and molybdenum(VI) oxide were co-deposited at a mass ratio of 1:0.5 (=DBT3P-II:molybdenum oxide), whereby the hole-injection layer 504 was formed over the first electrode 501. Note that the co-evaporation is an evaporation method in which a plurality of different substances are vaporized from the respective different evaporation sources at the same time. Note that the thickness of the hole-injection layer 504 in each of the light-emitting element 1 and the comparative light-emitting element 2 was set to 30 nm.

The hole-transport layer 505 was formed to a thickness of 10 nm by depositing PCPPn over the hole-injection layer 504.

The light-emitting layer (I) 506a was formed to have a thickness of 10 nm by co-depositing 7-[4-(10-phenyl-9-anthryl)phenyl]-7H-dibenzo[c,g]carbazole (abbreviation: cgDBCzPA) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) at a mass ratio of 1:0.025 (=cgDBCzPA: 1,6mMemFLPAPrn) over the hole-transport layer 505.

The light-emitting layer (II) 506b of the light-emitting element 1 illustrated in FIG. 5A has a stack of a plurality of layers, specifically, the first layer 506(b1), the second layer 506(b2), the third layer 506(b3), and the fourth layer 506(b4). Note that each of the second layer 506(b2), the third layer 506(b3), and the fourth layer 506(b4) can emit phosphorescent light due to energy transfer from an exciplex.

The first layer 506(b1) was formed to have a thickness of 2 nm by co-depositing 2-[3'-(dibenzothiophen-4-yl)biphenyl-3-yl]dibenzo quinoxaline (abbreviation: 2mDBTBP-DBq-II) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) at a mass ratio of 0.2:0.8 (=2mD-BTBPDBq-II:PCBBiF) over the light-emitting layer (I) 506a.

The second layer 506(b2) was formed to have a thickness of 5 nm by co-depositing 2mDBTBPDBq-II, PCBBiF, and (acetylacetonato)bis(6-tert-butyl-4-phenylpyrimidinato)iridium(III) (abbreviation: [Ir(tBuppm)$_2$(acac)]) at a mass ratio of 0.1:0.9:0.06 (=2mDBTBPDBq-II:PCBBiF:[Ir(tBuppm)$_2$(acac)]) over the first layer 506(b1).

The third layer 506(b3) was formed to have a thickness of 5 nm by co-depositing 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: [Ir(dmdppr-dmp)$_2$(acac)]) at a mass ratio of 0.1:0.9:0.03 (=2mDBTBPDBq-II:PCBBiF:[Ir(dmdppr-dmp)$_2$(acac)]) over the second layer 506(b2).

The fourth layer 506(b4) was formed to have a thickness of 20 nm by co-depositing 2mDBTBPDBq-II, PCBBiF, and [Ir(tBuppm)$_2$(acac)] at a mass ratio of 0.8:0.2:0.06 (=2mD-BTBPDBq-II:PCBBiF:[Ir(tBuppm)$_2$(acac)]) over the third layer 506(b3).

The second light-emitting layer (II) 506b' in the comparative light-emitting element 2 illustrated in FIG. 5B has a stack of a plurality of layers, specifically, the first layer 506(b1), a second layer 506(b2'), and a third layer 506(b3'). Note that since the first layer 506(b1) is the same as the first layer 506(b1) in the light-emitting element 1, it can be formed in the same manner, and the description of the first layer 506(b1) is omitted.

The second layer 506(b2') was formed to have a thickness of 5 nm by co-depositing 2mDBTBPDBq-II, PCBBiF, and [Ir(dmdppr-dmp)$_2$(acac)] at a mass ratio of 0.1:0.9:0.06 (2mDBTBPDBq-II:PCBBiF:[Ir(dmdppr-dmp)$_2$(acac)]) over the first layer 506(b1).

The third layer 506(b3') was formed to have a thickness of 20 nm by co-depositing 2mDBTBPDBq-II, PCBBiF, and [Ir(tBuppm)$_2$(acac)] at a mass ratio of 0.8:0.2:0.06 (=2mD-BTBPDBq-II:PCBBiF:[Ir(tBuppm)$_2$(acac)]) over the second layer 506(b2').

The electron-transport layer 507 was formed by depositing 2mDBTBPDBq-II to a thickness of 15 nm over each of the light-emitting layers (II) 506b and 506b' and then depositing Bphen (abbreviation) to a thickness of 15 nm.

The electron-injection layer 508 was formed by depositing lithium fluoride (LiF) to a thickness of 1 nm over the electron-transport layer 507.

The second electrode 502 was an electrode functioning as a cathode and formed in such a manner that silver (Ag) and magnesium (Mg) were co-deposited at a mass ratio of 1:0.5 to a thickness of 1 nm over the electron-injection layer 508, and then silver was deposited to a thickness of 150 nm by a sputtering method. Note that in all the above evaporation steps, evaporation was performed by a resistance-heating method.

Although not illustrated in FIGS. 5A and 5B, each of the fabricated light-emitting element 1 and comparative light-emitting element 2 was sealed in a glove box containing a nitrogen atmosphere so as not to be exposed to the air (specifically, a sealant was applied to an outer edge of the light-emitting element, irradiation with ultraviolet light with a wavelength of 365 nm was performed at 6 J/cm$^2$, and heat treatment was performed at 80° C. for 1 hour).

Table 1 shows element structures of the light-emitting element 1 and the comparative light-emitting element 2 fabricated as described above. Note that in Table 1, as to the light-emitting element 1, *[1] represents the light-emitting layer (I) 506a, and *[2], *[3], *[4], and *[5] respectively represent the first layer 506(b1), the second layer 506(b2), the third layer 506(b3), and the fourth layer 506(b4) included in the light-emitting layer (II) 506b. In addition, in Table 1, as to the comparative light-emitting element 2, *[2], *[6], and *[5] respectively represent the first layer 506(b1), the second layer 506(b2'), and the third layer 506(b3').

TABLE 1

|  | First electrode | Hole-injection layer | Hole-transport layer | Light-emitting layer (I) | Light-emitting layer (II) | | | |
|---|---|---|---|---|---|---|---|---|
| Light-emitting element 1 | ITO (110 nm) | DBT3P-II:MoOx (1:0.5 30 nm) | PCPPn (10 nm) | *[1] | *[2] | *[3] | *[4] | *[5] |
| Comparative light-emitting element 2 | | | | | *[2] | *[6] | *[5] | |

|  | Electron-transport layer | | Electron-injection layer | Second electrode | |
|---|---|---|---|---|---|
| Light-emitting element 1 | 2mDBTBPDBq-II (15 nm) | Bphen (15 nm) | LiF (1 nm) | Mg:Ag (1:0.5 1 nm) | Al (200 nm) |
| Comparative light-emitting element 2 | | | | | |

*[1] cgDBCzPA:1,6mMemFLPAPrn (1:0.025 10 nm)
*[2] 2mDBTBPDBq-II:PCBBiF (0.2:0.8 2 nm)
*[3] 2mDBTBPDBq-II:PCBBiF:[Ir(tBuppm)$_2$(acac)] (0.1:0.9:0.06 5 nm)
*[4] 2mDBTBPDBq-II:PCBBiF:[Ir(dmdppr-dmp)$_2$(acac)] (0.1:0.9:0.03 5 nm)
*[5] 2mDBTBPDBq-II:PCBBiF:[Ir(tBuppm)$_2$(acac)] (0.8:0.2:0.06 20 nm)
*[6] 2mDBTBPDBq-II:PCBBiF:[Ir(dmdppr-dmp)$_2$(acac)] (0.1:0.9:0.06 5 nm)

<<Element Characteristics of Light-Emitting Element 1 and Comparative Light-Emitting Element 2>>

First, a hemispherical lens with a refractive index of 2.0 was attached to a surface of the substrate of each of the fabricated light-emitting element 1 and comparative light-emitting element 2, through which light is extracted, with the use of a contact liquid with a refractive index of 1.78. The total luminous flux of each light-emitting element was measured with an integrating sphere at room temperature (in an atmosphere kept at 25° C.). The results are shown in Table 2. Note that the results shown in Table 2 are initial values of main characteristics of the light-emitting element 1 and the comparative light-emitting element 2 at approximately 1000 cd/m$^2$.

correlated color temperature range of incandescent light (2600 K to 3250 K) in the correlated color temperature range defined by Japanese Industrial Standards (JIS) (specifically, 2600 K to 7100K).

Figure 6:
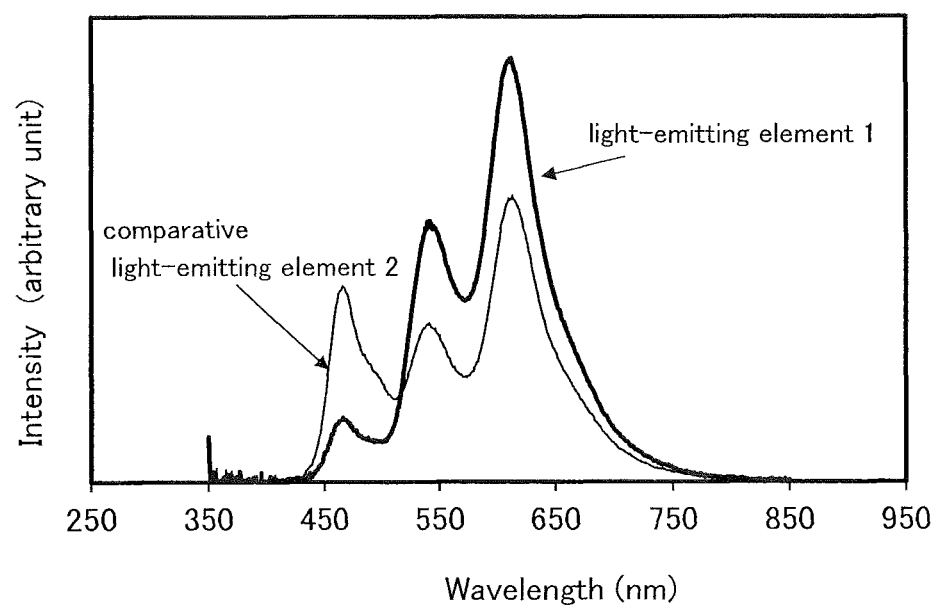
FIG. 6 shows emission spectra of the light-emitting element 1 and the comparative light-emitting element 2.

FIG. 6 shows emission spectra in the initial stage of driving of the light-emitting element 1 and the comparative light-emitting element 2 when a current with a current density of 3.75 mA/cm$^2$ was applied to the light-emitting elements. As shown in FIG. 6, both of the light-emitting element 1 and the comparative light-emitting element 2 have emission peaks at around 470 nm, 547 nm, and 613 nm. This indicates that the emission peaks are derived from fluorescence from the light-emitting layer (I) 506a and phosphorescence from the light-emitting layers (II) 506b and 506b'.

Note that the difference in the external quantum efficiency between the light-emitting element 1 and the comparative light-emitting element 2 probably resulted from the stacked-layer structure of the light-emitting layer (II) 506b in the light-emitting element 1. This can be explained by the fact that the intensities of green and red emissions having peaks at around 547 nm and 613 nm of the light-emitting element 1 are higher than those of the comparative light-emitting element 2.

TABLE 2

| | Voltage (V) | Current (A) | Luminous flux (lm) | Chromaticity (x, y) | Correlated color temperature (K) | Power efficiency (lm/W) | External quantum efficiency (%) |
|---|---|---|---|---|---|---|---|
| Light-emitting element 1 | 3.4 | 0.00015 | 0.048 | (0.49, 0.45) | 2600 | 93 | 43 |
| Comparative light-emitting element 2 | 3.2 | 0.00015 | 0.032 | (0.41, 0.37) | 3300 | 68 | 34 |

The results reveal that the light-emitting element 1 fabricated in this example has higher external quantum efficiency than the comparative light-emitting element 2. The results also reveal that the light-emitting element 1 emits light with a correlated color temperature that falls within the In other words, the light-emitting element 1 was formed such that the third layer 506(b3), which was formed between the second layer 506(b2) and the fourth layer 506(b4) in the light-emitting layer (II) 506b, emitted light having an emission peak wavelength longer than those of light emitted from the second layer 506(b2) and the fourth layer 506(b4), so that diffusion of excitons formed in the third layer 506(b3) to another layer was able to be suppressed. This probably resulted in the increased emission efficiency of the light-emitting element 1.

In addition, the reason why the intensity of blue light with an emission peak at around 470 nm of the light-emitting element 1 is lower than that of the comparative light-emitting element 2 can be explained as follows: phosphorescence can be efficiently emitted from the light-emitting layer (II) 506b for the above-described reason and the probability of energy transfer to the light-emitting layer (I) 506a was decreased.

As a result, the proportion of phosphorescence in the emissions of fluorescence and phosphorescence in the light-emitting element 1 became higher than that in the comparative light-emitting element 2. This probably resulted in the increased external quantum efficiency of the light-emitting element 1

Figure 7:
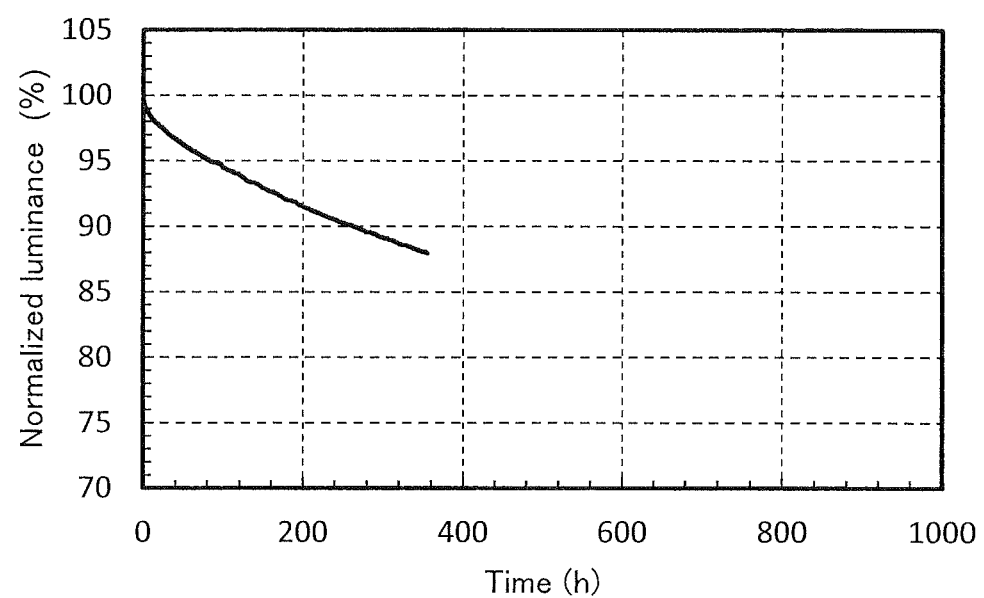
FIG. 7 shows reliability of the light-emitting element 1.

FIG. 7 shows results of a reliability test of the light-emitting element 1. In FIG. 7, the vertical axis represents normalized luminance (%) with an initial luminance of 100%, and the horizontal axis represents driving time (h) of the element. Note that in the reliability test, the light-emitting element 1 was driven under the conditions where the initial luminance was set to 5000 cd/m² and the current density was constant. Results of the reliability test reveal that the light-emitting element 1 has a long lifetime.

An element having the same structure as the light-emitting element 1 fabricated in this example was formed to have an emission area of 90 mm×90 mm over a substrate with a refractive index of 1.84 and a surface of the substrate through which light is extracted was frosted, whereby a lighting device with an emission area of 90 mm×90 mm was fabricated. Note that the thickness of ITO functioning as an anode was set to 70 nm. The fabricated lighting device had an excellent color rendering index (Ra) of 84 at a luminance of approximately 1000 cd/m² and a very high power efficiency of 92 lm/W. In addition, the color temperature of the lighting device was 2800 K that falls within the defined color temperature range of incandescent light.

EXAMPLE 2

In this example, a light-emitting element 3 was fabricated as a light-emitting element of one embodiment of the present invention, and characteristics of the light-emitting element were measured. Note that the light-emitting element 3 had the same structure as the light-emitting element 1 described in Example 1, and the light-emitting layer (I) 506a is a layer emitting fluorescent light and the light-emitting layer (II) 506b is a layer emitting phosphorescent light as illustrated in FIG. 5A. The light-emitting layer (II) 506b has a stacked-layer structure and was formed such that the third layer 506(b3), which was formed between the second layer 506(b2) and the fourth layer 506(b4), emitted light with an emission peak wavelength longer than those of light emitted from the second layer 506(b2) and the fourth layer 506(b4). Structural formulae and abbreviations of materials used in this example are shown below.

[Chemical Formulae 3]

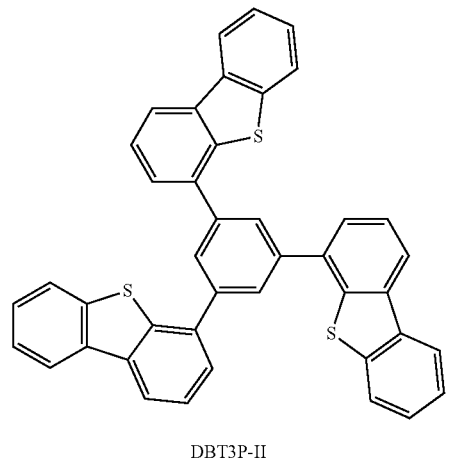

DBT3P-II

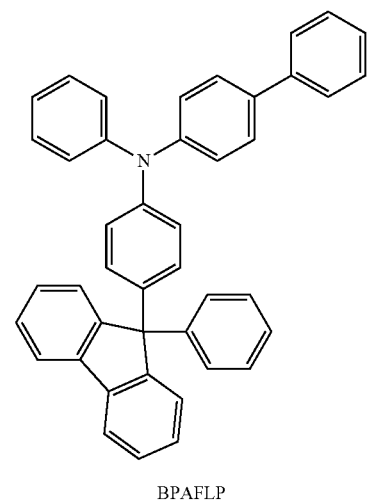

BPAFLP

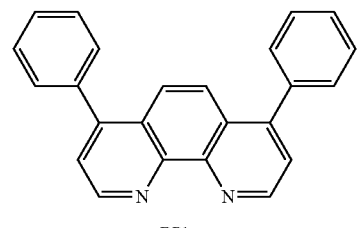

BPhen

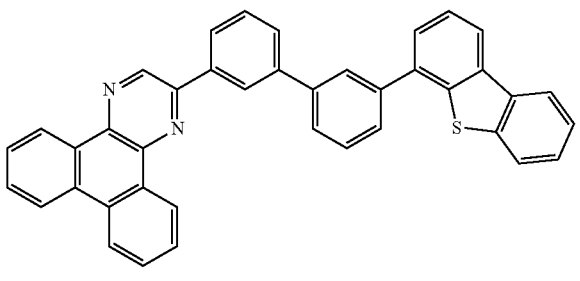

2mDBTBPDBq-II

-continued
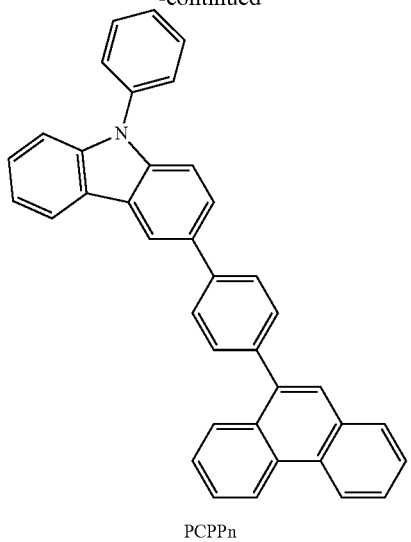
PCPPn
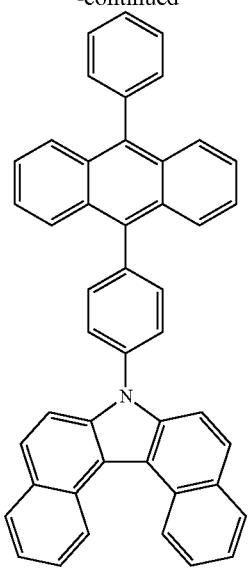
-continued
cgDBCzPA
[Ir(tBuppm)₂(acac)]
[Chemical Formula 4]
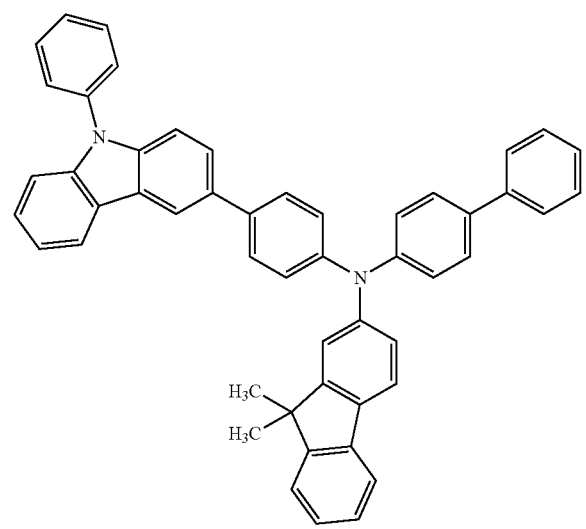
PCBBiF
1,6mMemFLPAPm
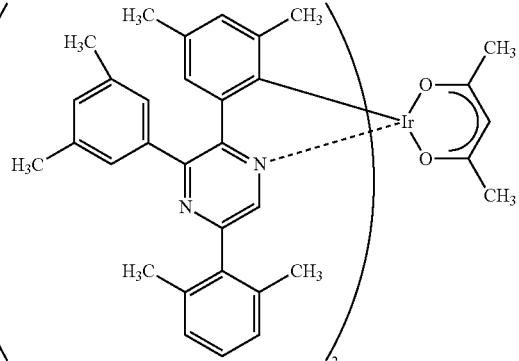
[Ir(dmdppr-dmp)₂(acac)]

<<Fabrication of Light-Emitting Element 3>>

The first electrode 501 was an electrode functioning as an anode and formed in such a manner that indium tin oxide containing silicon oxide (ITSO) was deposited to a thickness of 70 nm over the glass substrate 500 with a refractive index of 1.84 by a sputtering method. The electrode area was set to 81 cm². A surface of the substrate through which light is extracted was frosted.

The fabrication method and the like of the light-emitting element 3 described in this example are the same as those of the light-emitting element 1 and the comparative light-emitting element 2 described in Example 1 except for the electrode area. Table 3 shows an element structure showing characteristics of the light-emitting element 3, and detailed description is omitted. Note that fluorescence is obtained from the light-emitting layer (I) 506a and phosphorescence due to energy transfer from an exciplex is obtained from each of the second layer 506(b2), the third layer 506(b3), and the fourth layer 506(b4) included in the light-emitting layer (II) 506b as in the case of the light-emitting element 1. In Table 3, as to the light-emitting element 3, *[1] represents the light-emitting layer (I) 506a, and *[2], *[3], *[4], and *[5] respectively represent the first layer 506(b1), the second layer 506(b2), the third layer 506(b3), and the fourth layer 506(b4) included in the light-emitting layer (II) 506b.

incandescent light (2600 K to 3250 K) in the correlated color temperature range defined by Japanese Industrial Standards (JIS) (specifically, 2600 K to 7100 K).

Figure 9:
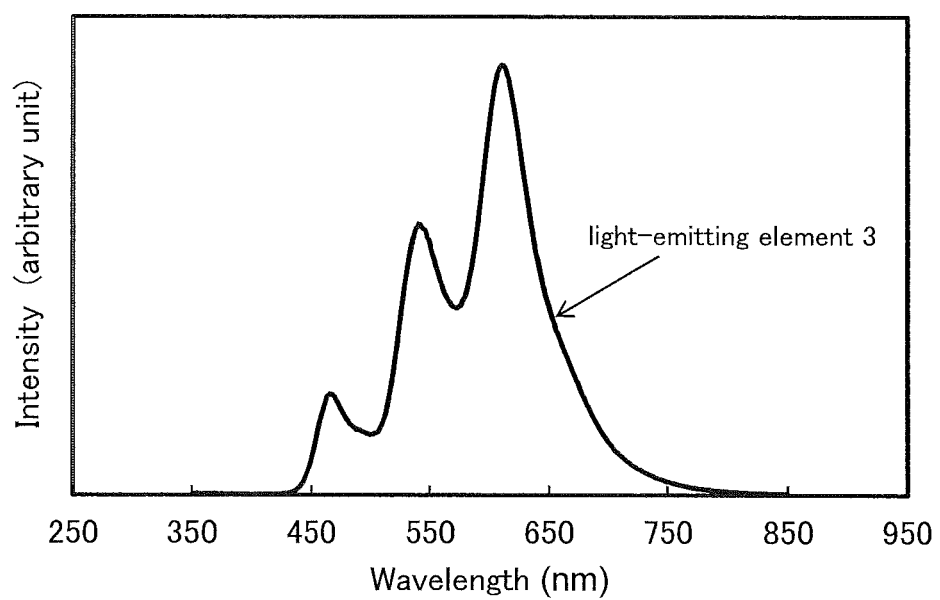
FIG. 9 shows an emission spectrum of the light-emitting element 3.

FIG. 9 shows an emission spectrum in the initial stage of driving of the light-emitting element 3 when a current with a current density of 1.2 mA/cm² was applied to the light-emitting element 3. As shown in FIG. 9, the light-emitting element 3 has emission peaks at around 470 nm, 547 nm, and 613 nm. This indicates that the emission peaks are derived from fluorescence from the light-emitting layer (I) 506a and phosphorescence from the light-emitting layer (II) 506b.

The intensity of red light with an emission peak at around 613 nm is much higher than that of blue light with an emission peak at around 470 nm of the light-emitting element 3 described in this example. Thus, diffusion of excitons formed in the third layer 506(b3), which was formed between the second layer 506(b2) and the fourth layer 506(b4) in the light-emitting layer (II) 506b of the light-emitting element 3, to another layer was suppressed and the proportion of phosphorescence in the emissions of fluorescence and phosphorescence was increased. This probably resulted in the increased external quantum efficiency.

TABLE 3

|  | First electrode | Hole-injection layer | Hole-transport layer | Light-emitting layer (I) | Light-emitting layer (II) | | | |
| --- | --- | --- | --- | --- | --- | --- | --- | --- |
| Light-emitting element 3 | ITSO (70 nm) | DBT3P-II:MoOx (1:0.5 30 nm) | PCPPn (10 nm) | *[1] | *[2] | *[3] | *[4] | *[5] |

|  | Electron-transport layer | | Electron-injection layer | Second electrode | |
| --- | --- | --- | --- | --- | --- |
| Light-emitting element 3 | 2mDBTBPDBq-II (15 nm) | Bphen (15 nm) | LiF (1 nm) | Mg:Ag (1:0.5 1 nm) | Ag (150 nm) |

*[1] cgDBCzPA:1,6mMemFLPAPrn(1:0.025 10 nm)
*[2] 2mDBTBPDBq-II:PCBBiF(0.2:0.8 2 nm)
*[3] 2mDBTBPDBq-II:PCBBiF:[Ir(tBuppm)$_2$(acac)] (0.1:0.9:0.06 5 nm)
*[4] 2mDBTBPDBq-II:PCBBiF:[Ir(dmdppr-dmp)$_2$(acac)] (0.1:0.9:0.03 5 nm)
*[5] 2mDBTBPDBq-II:PCBBiF:[Ir(tBuppm)$_2$(acac)] (0.7:0.3:0.06 20 nm)

<<Element Characteristics of Light-Emitting Element 3>>

Figure 8:
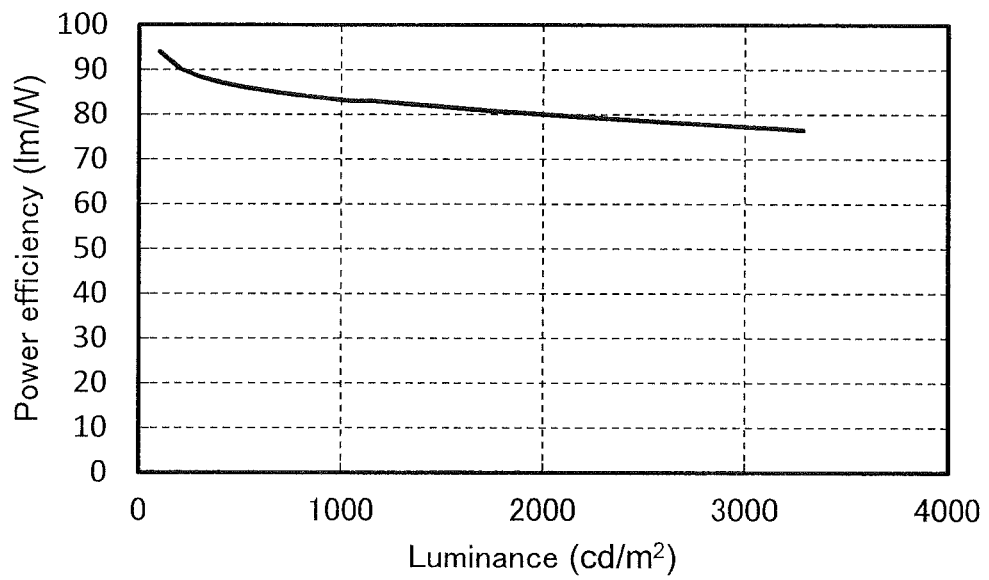
FIG. 8 shows luminance-power efficiency characteristics of a light-emitting element 3.

Characteristics of the fabricated light-emitting element 3 were measured at room temperature (in an atmosphere kept at 25° C.). The results are shown in FIG. 8 and Table 4. Note that the results shown in Table 4 are initial values of main characteristics of the light-emitting element 3 at approximately 1000 cd/m².

EXAMPLE 3

In this example, a light-emitting element 4 was fabricated as a light-emitting element of one embodiment of the present invention, and characteristics of the light-emitting element 4 were measured. Note that the light-emitting element 4 had the same structure as the light-emitting element 1 described

TABLE 4

|  | Voltage (V) | Current (A) | Luminous flux (lm) | Chromaticity (x, y) | Correlated color temperature (K) | Power efficiency (lm/W) | External quantum efficiency (%) |
| --- | --- | --- | --- | --- | --- | --- | --- |
| Light-emitting element 3 | 3.2 | 0.09 | 24 | (0.47, 0.44) | 2800 | 84 | 37 |

The results reveal that the light-emitting element 3 fabricated in this example has external quantum efficiency as high as that of the light-emitting element 1 described in Example 1. The results also reveal that the light-emitting element 3 emits light with a correlated color temperature that falls within the correlated color temperature range of in Example 1, and the light-emitting layer (I) 506a is a layer emitting fluorescent light and the light-emitting layer (II) 506b is a layer emitting phosphorescent light as illustrated in FIG. 5A. The light-emitting layer (II) 506b has a stacked-layer structure and was formed such that the third layer 506(b3), which was formed between the second layer 506

(b2) and the fourth layer 506(b4), emitted light with an emission peak wavelength longer than those of light emitted from the second layer 506(b2) and the fourth layer 506(b4). Structural formulae and abbreviations of materials used in this example are shown below.
[Chemical Formulae 5]
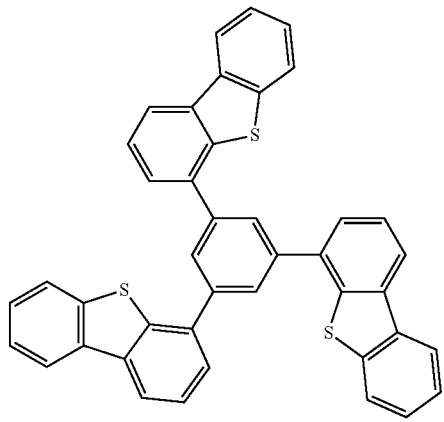
DBT3P-II
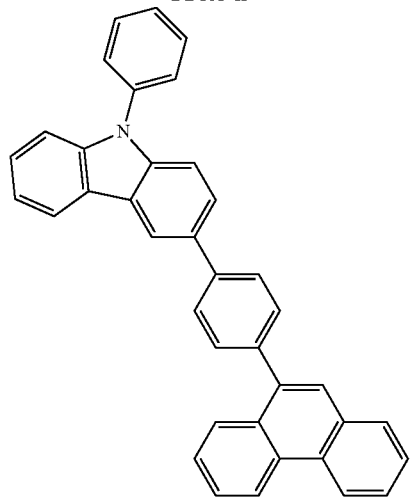
PCPPn
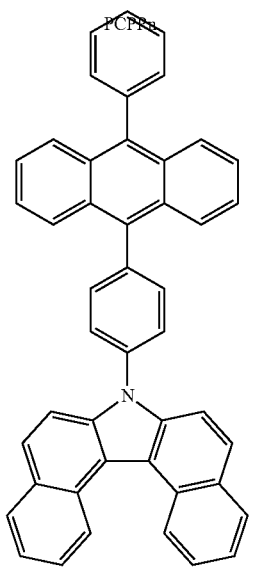
cgDBCzPA
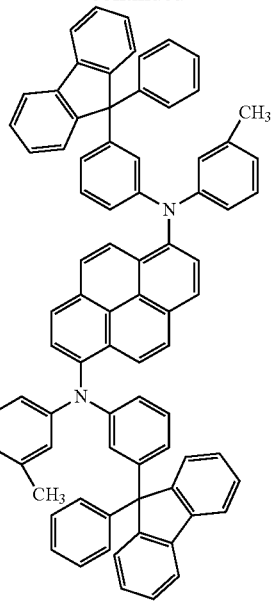
1,6mMemFLPAPm
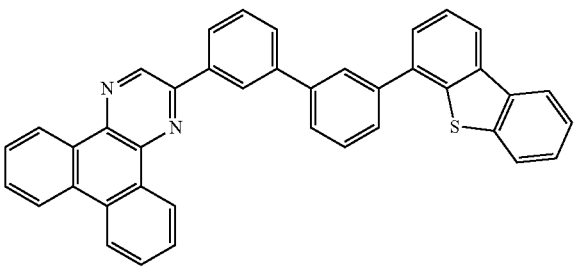
2mDBTBPDBq-II
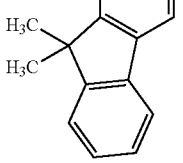
PCBBiF

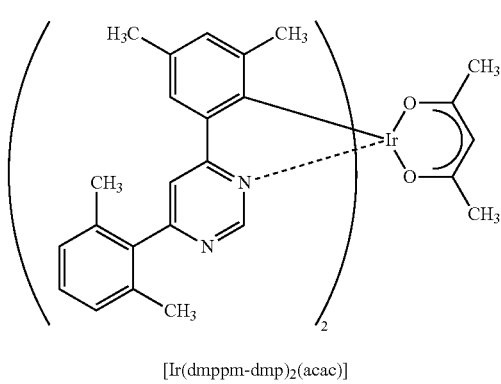

[Ir(dmppm-dmp)₂(acac)]

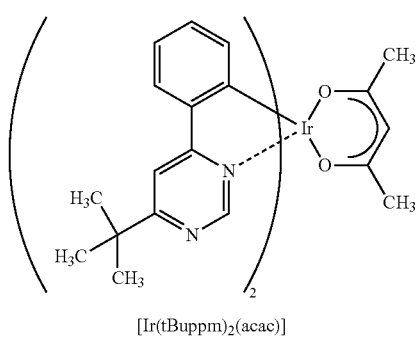

[Ir(tBuppm)₂(acac)]

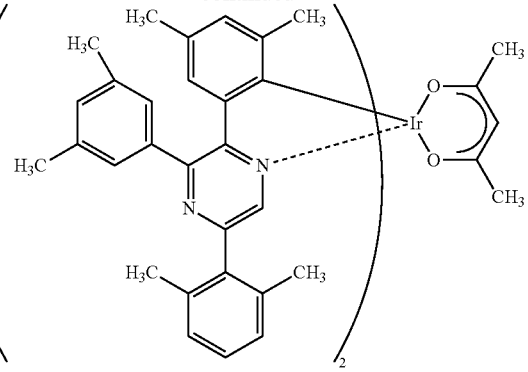

[Ir(dmdppr-dmp)₂(acac)]

<<Fabrication of Light-Emitting Element 4>>

The first electrode 501 was an electrode functioning as an anode and formed in such a manner that indium tin oxide containing silicon oxide (ITSO) was deposited to a thickness of 110 nm over a glass substrate 500 by a sputtering method. The electrode area was set to 2 mm×2 mm.

The fabrication method and the like of the light-emitting element 4 described in this example are the same as those of the light-emitting element 1 described in Example 1. Table 5 shows an element structure showing characteristics of the light-emitting element 4, and detailed description is omitted. Note that in the light-emitting element 4, fluorescence is obtained from the light-emitting layer (I) 506a and phosphorescence due to energy transfer from an exciplex is obtained from each of the second layer 506(b2), the third layer 506(b3), and the fourth layer 506(b4) included in the light-emitting layer (II) 506b. In Table 5, as to the light-emitting element 4, *¹ represents the light-emitting layer (I) 506a, and *², *³, *⁴, and *⁵ respectively represent the first layer 506(b1), the second layer 506(b2), the third layer 506(b3), and the fourth layer 506(b4) included in the light-emitting layer (II) 506b.

TABLE 5

| | First electrode | Hole-injection layer | Hole-transport layer | Light-emitting layer (I) | Light-emitting layer (II) | | | |
|---|---|---|---|---|---|---|---|---|
| Light-emitting element 4 | ITSO (110 nm) | DBT3P-II:MoOx (2:1 15 nm) | PCPPn (20 nm) | *¹ | *² | *³ | *⁴ | *⁵ |

| | Electron-transport layer | | Electron-injection layer | Second electrode | |
|---|---|---|---|---|---|
| Light-emitting element 4 | 2mDBTBPDBq-II (15 nm) | Bphen (15 nm) | LiF (1 nm) | Mg:Ag (1:0.5 1 nm) | Ag (150 nm) |

*¹ cgDBCzPA:1,6mMemFLPAPrn (2:0.05 10 nm)

*² 2mDBTBPDBq-II:PCBBiF (0.4:1.6 2 nm)

*³ 2mDBTBPDBq-II:PCBBiF:[Ir(dmppm-dmp)₂(acac)] (0.2:0.8:0.06 5 nm)

*⁴ 2mDBTBPDBq-II:PCBBiF:[Ir(dmdppr-dmp)₂(acac)] (0.3:0.7:0.03 5 nm)

*⁵ 2mDBTBPDBq-II:PCBBiF:[Ir(tBuppm)₂(acac)] (1.6:0.4:0.12 20 nm)

<<Element Characteristics of Light-Emitting Element 4>>

Figure 10:
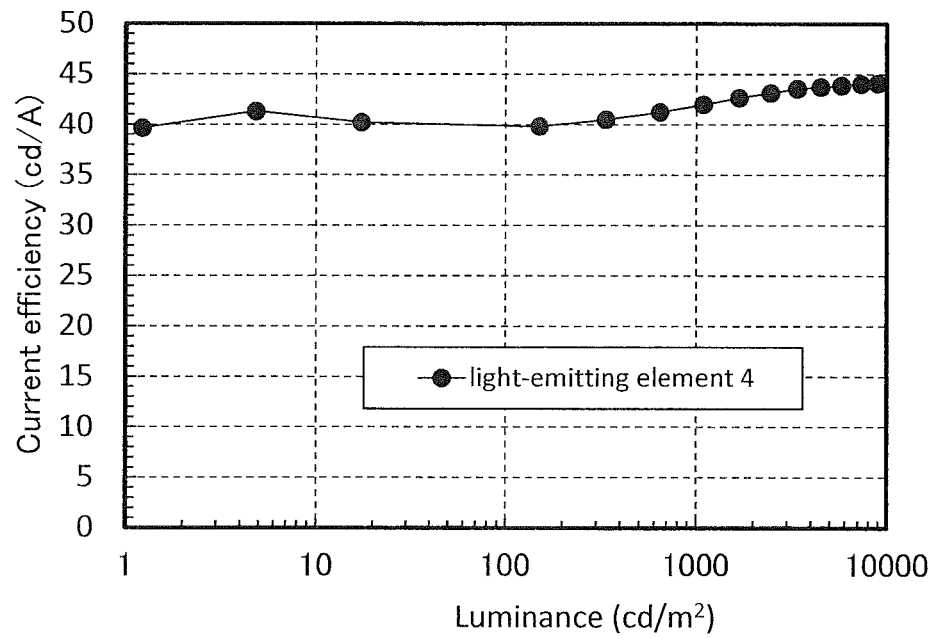
FIG. 10 shows luminance-current efficiency characteristics of a light-emitting element 4.

Characteristics of the fabricated light-emitting element 4 were measured at room temperature (in an atmosphere kept at 25° C.). The results are shown in FIG. 10 and Table 6. Note that the results shown in Table 6 are initial values of main characteristics of the light-emitting element 4 at approximately 1000 cd/m$^2$.

TABLE 6

| | Voltage (V) | Current (A) | Luminous flux (lm) | Chromaticity (x, y) | Correlated color temperature (K) | Power efficiency (lm/W) | External quantum efficiency (%) |
|---|---|---|---|---|---|---|---|
| Light-emitting element 4 | 3.2 | 0.1 | 2.6 | (0.46, 0.45) | 3000 | 41 | 17 |

The results reveal that the light-emitting element 4 fabricated in this example has high external quantum efficiency. The results also reveal that the light-emitting element 4 emits light with a correlated color temperature that falls within the correlated color temperature range of incandescent light (2600 K to 3250 K) in the correlated color temperature range defined by Japanese Industrial Standards (HS) (specifically, 2600 K to 7100 K).

Figure 11:
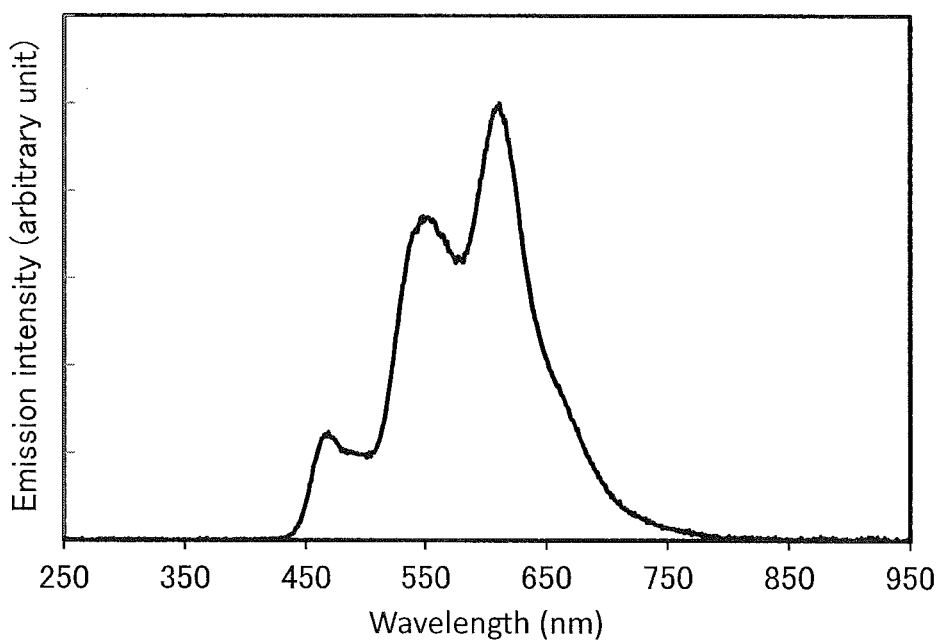
FIG. 11 shows an emission spectrum of the light-emitting element 4.

FIG. 11 shows an emission spectrum in the initial stage of driving of the light-emitting element 4 when a current with a current density of 3.75 mA/cm$^2$ was applied to the light-emitting element 4. As shown in FIG. 11, the light-emitting element 4 has emission peaks at around 469 nm, 550 nm, and 611 nm. This indicates that the emission peaks are derived from fluorescence from the light-emitting layer (I) 506a and phosphorescence from the light-emitting layer (II) 506b.

The intensity of red light with an emission peak at around 611 nm is much higher than that of blue light with an emission peak at around 469 nm of the light-emitting element 4 described in this example. Thus, diffusion of excitons generated in the third layer 506(b3), which was formed between the second layer 506(b2) and the fourth layer 506(b4) in the light-emitting layer (II) 506b of the light-emitting element 4, to another layer was suppressed and the proportion of phosphorescence in the emissions of fluorescence and phosphorescence was increased. This probably resulted in the increased external quantum efficiency.

An element having the same structure as the light-emitting element 4 fabricated in this example was formed to have an emission area of 90 mm×90 mm over a substrate with a refractive index of 1.84 and a surface of the substrate through which light is extracted is frosted, whereby a lighting device with an emission area of 90 mm×90 mm was fabricated. Note that ITO was used as an anode and the thickness of the anode was set to 70 nm. The fabricated lighting device had an excellent color rendering index (Ra) of 83 at a luminance of approximately 1000 cd/m$^2$ and a high power efficiency of 81 lm/W. In addition, the color temperature of the lighting device was 3200 K that falls within the defined color temperature range of warm white light.

EXPLANATION OF REFERENCE

101: first electrode, 102: second electrode, 103: EL layer, 104: hole-injection layer, 105: hole-transport layer, 106: light-emitting layer, 106a: light-emitting layer (I), 106b: light-emitting layer (II), 106(b1): first layer, 106(b2): second layer, 106(b3): third layer, 107: electron-transport layer, 108: electron-injection layer, 201: element substrate, 202: pixel portion, 203: driver circuit portion (source line driver circuit), 204a and 204b: driver circuit portion (gate line driver circuit), 205: sealant, 206: sealing substrate, 207: wiring, 208: flexible printed circuit (FPC), 209: FET, 210: FET, 211: switching FET, 212: current control FET, 213: first electrode (anode), 214: insulator, 215: EL layer, 216: second electrode (cathode), 217: light-emitting element, 218: space, 500: substrate, 501: first electrode, 502: second electrode, 503: EL layer, 504: hole-injection layer, 505: hole-transport layer, 506: light-emitting layer, 506a: light-emitting layer (I), 506b: light-emitting layer (II), 506(b1): first layer, 506(b2): second layer, 506(b3): third layer, 506(b4): fourth layer, 506b': light-emitting layer (II), 506(b2'): second layer, 506(b3'): third layer, 507: electron-transport layer, 508: electron-injection layer, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7302: housing, 7304: display panel, 7305: icon indicating time, 7306: other icons, 7311: operation button, 7312: operation button, 7313: connection terminal, 7321: band, 7322: clasp, 7400: mobile phone, 7401: housing, 7402: display portion, 7403: operation button, 7404: external connection portion, 7405: speaker, 7406: microphone, 7407: camera, 7500(1) and 7500(2): housing, 7501(1) and 7501(2): first screen, 7502(1) and 7502(2): second screen, 8001: lighting device, 8002: lighting device, 8003: lighting device, and 8004: lighting device.

This application is based on Japanese Patent Application serial No. 2013-249206 filed with the Japan Patent Office on Dec. 2, 2013 and Japanese Patent Application serial No. 2014-101046 filed with the Japan Patent Office on May 15, 2014, the entire contents of which are hereby incorporated by reference.

The invention claimed is:

1. A light-emitting element comprising:
a stack of a first light-emitting layer and a second light-emitting layer, the stack being between a pair of electrodes,
wherein the first light-emitting layer contains a fluorescent substance,
wherein the second light-emitting layer comprises a first layer, a second layer over the first layer, a third layer over the second layer, a fourth layer over the third layer,
wherein each of the second layer, the third layer, and the fourth layer contains a phosphorescent substance, and
wherein an emission peak wavelength of the third layer is longer than an emission peak wavelength of the second layer and an emission peak wavelength of the fourth layer.

2. The light-emitting element according to claim 1, wherein no charge-generation layer is provided between the first light-emitting layer and the second light-emitting layer.

3. The light-emitting element according to claim 1,
wherein the fluorescent substance is dispersed in an organic compound included in the first light-emitting layer, and
wherein the phosphorescent substance is dispersed in organic compounds included in the second light-emitting layer.

4. The light-emitting element according to claim 1, wherein the first light-emitting layer and the second light-emitting layer are in contact with each other.

5. The light-emitting element according to claim 1, wherein the third layer is in contact with the second layer and the fourth layer.

6. The light-emitting element according to claim 1, wherein each of the second layer, the third layer, and the fourth layer contains substances forming an exciplex.

7. The light-emitting element according to claim 1,
wherein the second layer and the fourth layer contain the same substances forming an exciplex, and
wherein the phosphorescent substance in the second layer and the phosphorescent substance in the fourth layer are the same phosphorescent substance.

8. The light-emitting element according to claim 1,
wherein the first light-emitting layer contains a host material, and
wherein a T1 level of the host material is lower than a T1 level of the fluorescent substance.

9. A light-emitting device comprising:
a pixel portion comprising the light-emitting element according to claim 1;
a driver circuit electrically connected to the pixel portion; and
a flexible printed circuit electrically connected to the driver circuit.

10. A light-emitting element comprising:
a stack of a first light-emitting layer and a second light-emitting layer, the stack being between a pair of electrodes,
wherein the first light-emitting layer contains a fluorescent substance,
wherein the second light-emitting layer comprises a first layer, a second layer over the first layer, a third layer over the second layer, a fourth layer over the third layer,
wherein each of the second layer, the third layer, and the fourth layer contains a phosphorescent substance,
wherein an emission peak wavelength of the third layer is longer than an emission peak wavelength of the second layer and an emission peak wavelength of the fourth layer, and
wherein a thickness of the third layer is smaller than a thickness of the second layer and a thickness of the fourth layer.

11. The light-emitting element according to claim 10, wherein no charge-generation layer is provided between the first light-emitting layer and the second light-emitting layer.

12. The light-emitting element according to claim 10,
wherein the fluorescent substance is dispersed in an organic compound included in the first light-emitting layer, and
wherein the phosphorescent substance is dispersed in organic compounds included in the second light-emitting layer.

13. The light-emitting element according to claim 10, wherein the first light-emitting layer and the second light-emitting layer are in contact with each other.

14. The light-emitting element according to claim 10, wherein the third layer is in contact with the second layer and the fourth layer.

15. The light-emitting element according to claim 10, wherein each of the second layer, the third layer, and the fourth layer contains substances forming an exciplex.

16. The light-emitting element according to claim 10,
wherein the second layer and the fourth layer contain the same substances forming an exciplex, and
wherein the phosphorescent substance in the second layer and the phosphorescent substance in the fourth layer are the same phosphorescent substance.

17. The light-emitting element according to claim 10,
wherein the first light-emitting layer contains a host material, and
wherein a T1 level of the host material is lower than a T1 level of the fluorescent substance.

18. A light-emitting device comprising:
a pixel portion comprising the light-emitting element according to claim 10;
a driver circuit electrically connected to the pixel portion; and
a flexible printed circuit electrically connected to the driver circuit.

19. A light-emitting element comprising:
a stack of a first light-emitting layer and a second light-emitting layer, the stack being between a pair of electrodes,
wherein the first light-emitting layer contains a fluorescent substance,
wherein the second light-emitting layer comprises a first layer, a second layer over the first layer, a third layer over the second layer, a fourth layer over the third layer,
wherein each of the second layer, the third layer, and the fourth layer contains a phosphorescent substance, and
wherein the first layer contain a first organic substance and a second organic substance,
wherein the second layer contain the first organic substance and the second organic substance,
wherein an emission peak wavelength of the third layer is longer than an emission peak wavelength of the second layer and an emission peak wavelength of the fourth layer.

20. The light-emitting element according to claim 19, wherein no charge-generation layer is provided between the first light-emitting layer and the second light-emitting layer.

21. The light-emitting element according to claim 19,
wherein the fluorescent substance is dispersed in an organic compound included in the first light-emitting layer, and
wherein the phosphorescent substance is dispersed in organic compounds included in the second light-emitting layer.

22. The light-emitting element according to claim 19, wherein the first light-emitting layer and the second light-emitting layer are in contact with each other.

23. The light-emitting element according to claim 19, wherein the third layer is in contact with the second layer and the fourth layer.

24. The light-emitting element according to claim 19, wherein each of the second layer, the third layer, and the fourth layer contains substances forming an exciplex.

25. The light-emitting element according to claim 19,
wherein the second layer and the fourth layer contain the same substances forming an exciplex, and wherein the phosphorescent substance in the second layer and the phosphorescent substance in the fourth layer are the same phosphorescent substance.

26. The light-emitting element according to claim 19, wherein the first light-emitting layer contains a host material, and
wherein a T1 level of the host material is lower than a T1 level of the fluorescent substance.

27. A light-emitting device comprising:
a pixel portion comprising the light-emitting element according to claim 19;
a driver circuit electrically connected to the pixel portion; and
a flexible printed circuit electrically connected to the driver circuit.

* * * * *